(12) United States Patent
Kumagai et al.

(10) Patent No.: US 10,991,734 B2
(45) Date of Patent: Apr. 27, 2021

(54) IMAGING DEVICE AND ELECTRONIC DEVICE

(71) Applicant: SONY SEMICONDUCTOR SOLUTIONS CORPORATION, Kanagawa (JP)

(72) Inventors: Yoshimichi Kumagai, Kanagawa (JP); Takashi Abe, Kanagawa (JP); Ryoto Yoshita, Kanagawa (JP); Ikuhiro Yamamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/491,008

(22) PCT Filed: Mar. 9, 2018

(86) PCT No.: PCT/JP2018/009145
§ 371 (c)(1),
(2) Date: Sep. 4, 2019

(87) PCT Pub. No.: WO2018/173789
PCT Pub. Date: Sep. 27, 2018

(65) Prior Publication Data
US 2020/0013808 A1 Jan. 9, 2020

(30) Foreign Application Priority Data

Mar. 22, 2017 (JP) .............................. JP2017-055310

(51) Int. Cl.
*H01L 27/146* (2006.01)
(52) U.S. Cl.
CPC .... *H01L 27/1461* (2013.01); *H01L 27/14623* (2013.01); *H01L 27/14656* (2013.01)

(58) Field of Classification Search
CPC ........... H01L 27/1461; H01L 27/14623; H01L 27/14656
(Continued)

(56) References Cited

U.S. PATENT DOCUMENTS

| 2011/0032379 A1 | 2/2011 | Kobayashi et al. |
| 2011/0234836 A1 | 9/2011 | Machida |

(Continued)

FOREIGN PATENT DOCUMENTS

| JP | 2008-103647 | 5/2008 |
| JP | 2009-272539 | 11/2009 |

(Continued)

OTHER PUBLICATIONS

International Search Report prepared by the Japan Patent Office dated Apr. 4, 2018, for International Application No. PCT/JP2018/009145.

*Primary Examiner* — Tong-Ho Kim
(74) *Attorney, Agent, or Firm* — Sheridan Ross P.C.

(57) ABSTRACT

The present disclosure relates to an imaging device and an electronic device that make it possible to obtain a better pixel signal. A photoelectric conversion part that converts received light into a charge, and a holding part that holds a charge transferred from the photoelectric conversion part are provided, the photoelectric conversion part and the holding part are formed in a semiconductor substrate having a predetermined thickness, and the holding part is formed with a thickness that is half or less of the predetermined thickness. A charge capturing region that captures a charge is further provided on a light incident side of a region where the holding part is formed. A light shielding part that shields light is formed between the photoelectric conversion part and the charge capturing region. The present technology is applicable to an imaging device.

20 Claims, 23 Drawing Sheets

(58) Field of Classification Search
USPC .......................................................... 257/435
See application file for complete search history.

(56) References Cited

U.S. PATENT DOCUMENTS

| | | |
|---|---|---|
| 2012/0037960 A1 | 2/2012 | Yokoyama et al. |
| 2012/0153126 A1 | 6/2012 | Oike et al. |
| 2013/0070131 A1* | 3/2013 | Ohkubo ................ H04N 5/374 348/294 |
| 2013/0215300 A1* | 8/2013 | Kobayashi ........ H01L 27/14612 348/294 |
| 2015/0256769 A1 | 9/2015 | Kim et al. |

FOREIGN PATENT DOCUMENTS

| | | |
|---|---|---|
| JP | 2010-232387 | 10/2010 |
| JP | 2011-204878 | 10/2011 |
| JP | 2012-089654 | 5/2012 |
| JP | 2012-129798 | 7/2012 |
| JP | 2013-065688 | 4/2013 |
| JP | 2013-171888 | 9/2013 |
| JP | 2014-096490 | 5/2014 |

* cited by examiner

IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2018/009145 having an international filing date of 9 Mar. 2018, which designated the United States, which PCT application claimed the benefit of Japanese Patent Application No. 2017-055310 filed 22 Mar. 2017, the entire disclosures of each of which are incorporated herein by reference.

TECHNICAL FIELD

The present disclosure relates to an imaging device and an electronic device, for example, to an imaging device and an electronic device that can obtain better pixel signals.

BACKGROUND ART

Imaging devices such as complementary metal oxide semiconductor (CMOS) image sensors and charge coupled devices (CCDs) are widely used in digital still cameras, digital video cameras, and the like.

For example, light incident on a CMOS image sensor is subjected to photoelectric conversion in a photodiode (PD) included in a pixel. Then, a charge generated in the PD is transferred to floating diffusion (FD) through a transfer transistor, and converted into a pixel signal having a level according to an amount of received light.

Meanwhile, in a conventional CMOS image sensor, since a scheme of sequentially reading pixel signals from respective pixels row by row, a so-called rolling shutter scheme is generally employed, distortion has sometimes occurred in an image due to a difference in exposure timing.

Therefore, for example, Patent Document 1 discloses a CMOS image sensor that employs a scheme of reading pixel signals from all pixels simultaneously by providing a charge holding part in each pixel, a so-called global shutter scheme, the CMOS image sensor having an all pixel simultaneous electronic shutter function. By employing the global shutter scheme, exposure timing becomes the same for all the pixels, making possible to avoid the occurrence of distortion in an image.

CITATION LIST

Patent Document

Patent Document 1: Japanese Patent Application Laid-Open No. 2008-103647

SUMMARY OF THE INVENTION

Problems to be Solved by the Invention

Since pixel layout is limited in a case where a configuration in which the charge holding part is provided in the pixel is employed, an aperture ratio decreases, and there is a concern that sensitivity of the PD may decrease or capacity of the PD and the charge holding part may decrease. Moreover, there is a concern that optical noise may be generated by light incident into the charge holding part while holding a charge.

The present technology has been made in view of such a situation, and makes it possible to obtain better pixel signals.

Solutions to Problems

An imaging device according to one aspect of the present technology includes: a photoelectric conversion part configured to convert received light into a charge; and a holding part configured to hold a charge transferred from the photoelectric conversion part, in which the photoelectric conversion part and the holding part are formed in a semiconductor substrate having a predetermined thickness, and the holding part is formed with a thickness that is half or less of the predetermined thickness.

An electronic device according to one aspect of the present technology includes: an imaging device including: a photoelectric conversion part configured to convert received light into a charge; and a holding part configured to hold a charge transferred from the photoelectric conversion part, the photoelectric conversion part and the holding part being formed in a semiconductor substrate having a predetermined thickness, the holding part being formed with a thickness that is half or less of the predetermined thickness; and a processing unit configured to process a signal from the imaging device.

The imaging device according to one aspect of the present technology includes the photoelectric conversion part that converts received light into a charge, and the holding part that holds a charge transferred from the photoelectric conversion part. The photoelectric conversion part and the holding part are formed in a semiconductor substrate having a predetermined thickness, and the holding part is formed with a thickness of half or less of the predetermined thickness.

The electronic device according to one aspect of the present technology includes the imaging device.

Effects of the Invention

According to one aspect of the present technology, better pixel signals can be obtained.

Note that advantageous effects described here are not necessarily restrictive, and any of the effects described in the present disclosure may be applied.

MODE FOR CARRYING OUT THE INVENTION

A mode for carrying out the present technology (hereinafter referred to as an embodiment) will be described below.
<Configuration of Imaging Device>

Figure 1:
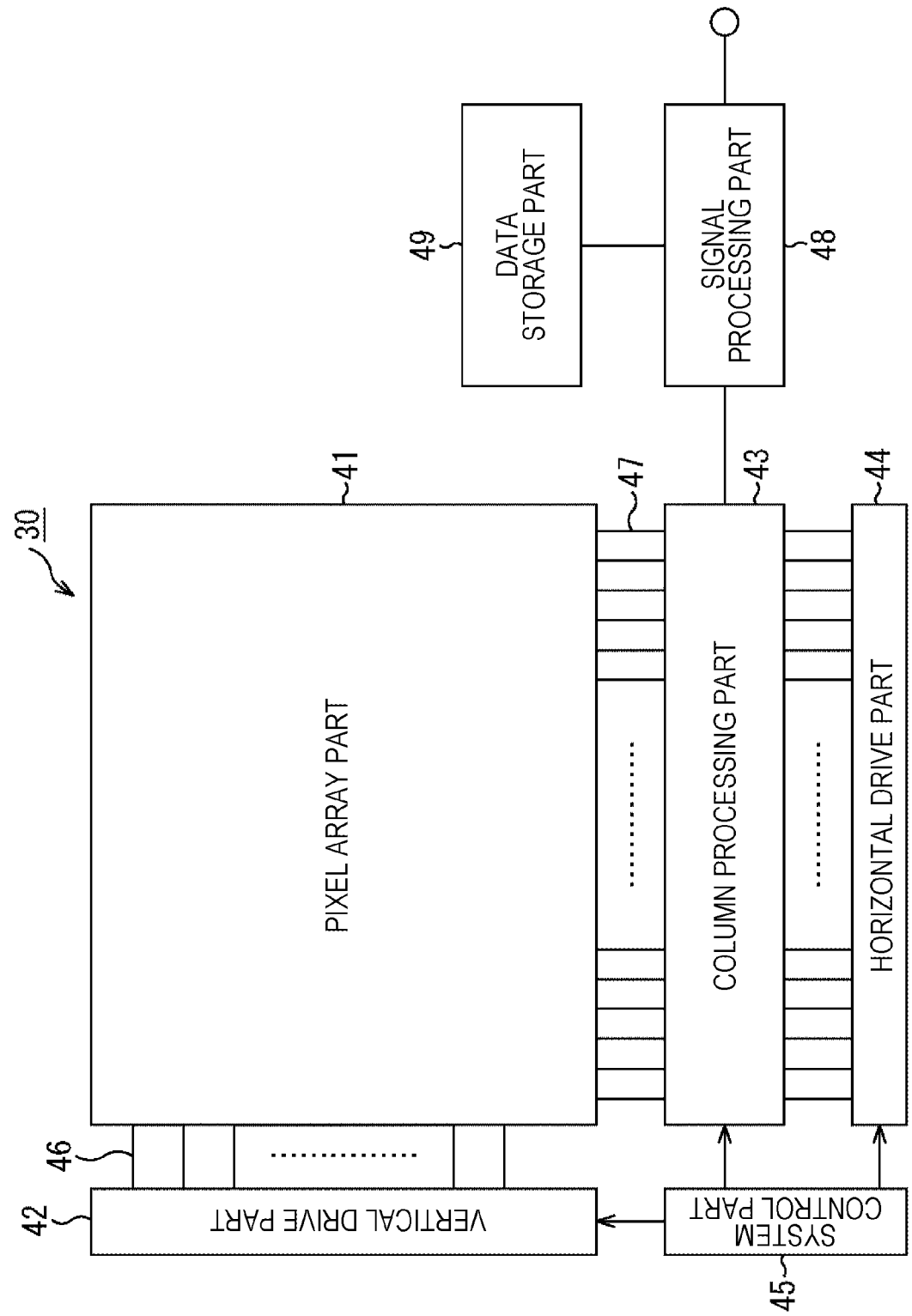
FIG. 1 is a diagram showing a configuration of an image sensor.

FIG. 1 is a block diagram showing an exemplary configuration of a complementary metal oxide semiconductor (CMOS) image sensor as an imaging device to which the present invention is applied.

The CMOS image sensor 30 includes a pixel array part 41, a vertical drive part 42, a column processing part 43, a horizontal drive part 44, and a system control part 45. The pixel array part 41, the vertical drive part 42, the column processing part 43, the horizontal drive part 44, and the system control part 45 are formed on a semiconductor substrate (chip) which is not shown.

In the pixel array part 41, unit pixels (pixel 50 in FIG. 2) each including a photoelectric conversion element that generates and internally accumulates a light charge of a charge amount according to an incident light amount are arranged two-dimensionally in a matrix. Note that in the following, the light charge of a charge amount according to an incident light amount may be simply described as "charge", and the unit pixel may be simply described as "pixel."

In the pixel array part 41, furthermore, pixel drive lines 46 are formed along a horizontal direction in the drawing (arrangement direction of pixels in a pixel row) for each row of the matrix pixel array, and vertical signal lines 47 are formed along a vertical direction in the drawing (arrangement direction of pixels in a pixel column) for each column. One end of each pixel drive line 46 is connected to an output end corresponding to each row of the vertical drive part 42.

The CMOS image sensor 30 further includes a signal processing part 48 and a data storage part 49. The signal processing part 48 and the data storage part 49 may be an external signal processing part provided on a substrate different from the CMOS image sensor 30, for example, processing by a digital signal processor (DSP) or software, or may be mounted on the same substrate as the CMOS image sensor 30.

The vertical drive part 42 is a pixel drive part that includes a shift register, an address decoder, or the like, and drives respective pixels of the pixel array part 41 in a manner of driving all pixels at the same time, pixels of respective rows, or the like. This vertical drive part 42 includes a reading scanning system, a sweeping scanning system, or batch sweep, and batch transfer, although illustration of the specific configuration thereof is omitted.

The reading scanning system sequentially selects and scans the unit pixels of respective rows of the pixel array part 41 in order to read signals from the unit pixels. In a case of row drive (rolling shutter operation), regarding sweeping, sweeping scan is performed on a read row on which reading scan is performed by the reading scanning system in advance of the reading scan by a time of a shutter speed. Furthermore, in a case of global exposure (global shutter operation), batch sweeping is performed in advance of batch transfer by a time of the shutter speed.

By this sweeping, unnecessary charges are swept (reset) from the photoelectric conversion elements of the unit pixels of the read row. Then, a so-called electronic shutter operation is performed by sweeping (resetting) unnecessary charges. Here, the electronic shutter operation is an operation of discarding the light charges of the photoelectric conversion elements and newly starting exposure (starting accumulation of light charges).

The signal read by the reading operation by the reading scanning system corresponds to the light amount incident after the immediately preceding reading operation or the electronic shutter operation. In a case of row drive, a period from a reading timing by the immediately preceding reading operation or a sweeping timing by the electronic shutter operation to a reading timing by the current reading operation is a light charge accumulation period (exposure period) in the unit pixel. In a case of global exposure, a period from the batch sweeping to the batch transfer is the accumulation period (exposure period).

A pixel signal output from each unit pixel of the pixel row selected and scanned by the vertical drive part 42 is supplied to the column processing part 43 through each of the vertical signal lines 47. The column processing part 43 performs predetermined signal processing on the pixel signal output from each unit pixel of the selected row through the vertical signal line 47 for each pixel column of the pixel array part 41, and temporarily holds the pixel signal subjected to signal processing.

Specifically, the column processing part 43 performs at least noise removal processing, for example, correlated double sampling (CDS) processing as the signal processing. Pixel-specific fixed pattern noise such as reset noise and threshold variation of amplification transistors is removed by the correlated double sampling performed by the column processing part 43. Note that it is possible to cause the column processing part 43 to have, for example, an analog-digital (AD) conversion function in addition to the noise removal processing, and to output a signal level as a digital signal.

The horizontal drive part 44 includes a shift register, an address decoder, and the like, and selects the unit circuits corresponding to the pixel column of the column processing part 43 sequentially. The pixel signals subjected to signal processing by the column processing part 43 are sequentially output to the signal processing part 48 by the selection and scanning performed by the horizontal drive part 44.

The system control part 45 includes a timing generator that generates various timing signals and the like, and controls driving of the vertical drive part 42, the column processing part 43, the horizontal drive part 44, and the like on the basis of the various timing signals generated by the timing generator.

The signal processing part 48 has at least an addition processing function, and performs various types of signal processing such as addition processing on the pixel signal output from the column processing part 43. When the signal processing part 48 performs signal processing, the data storage part 49 temporarily stores data necessary for the processing.

<Structure of Unit Pixel>

Figure 2:
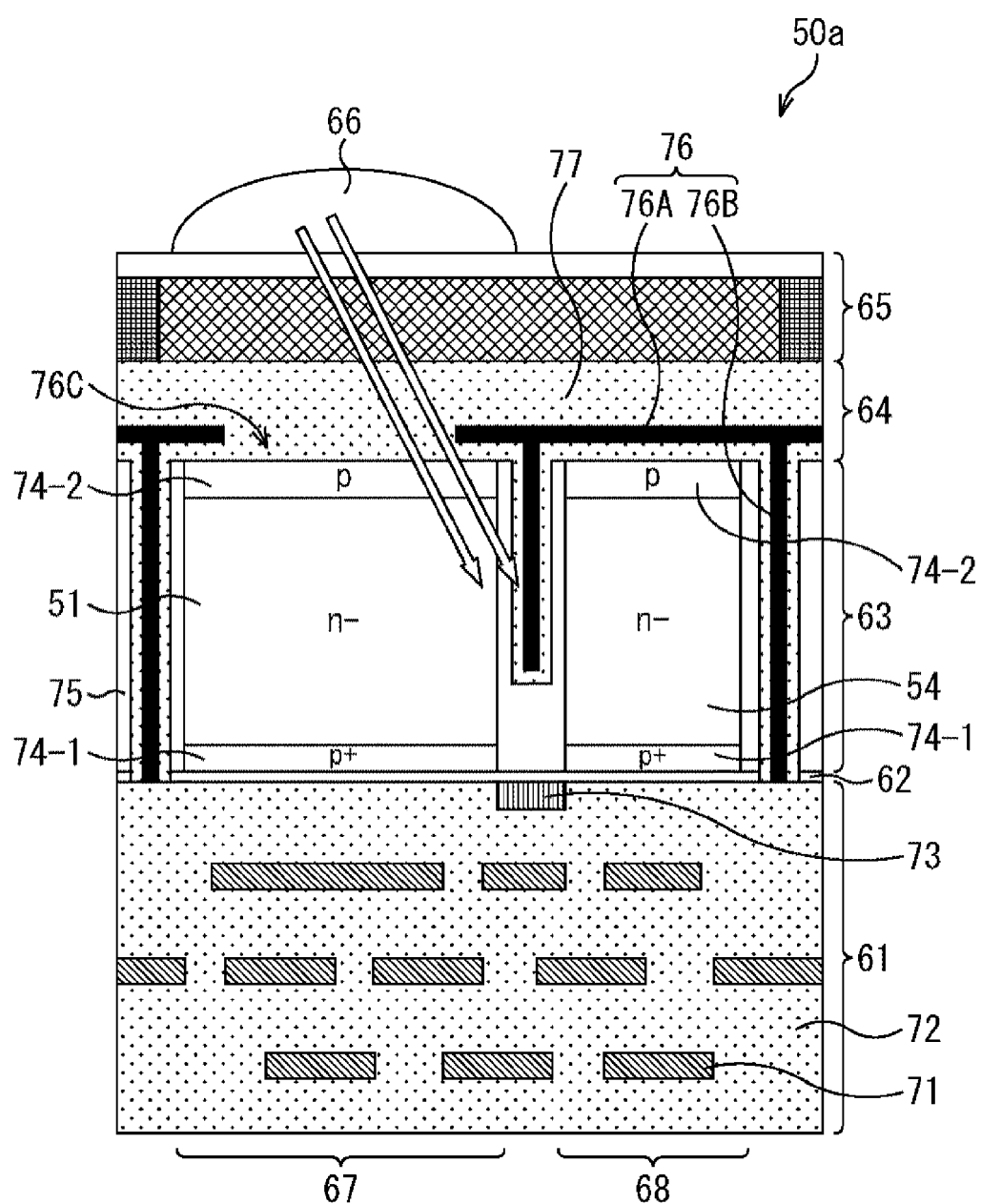
FIG. 2 is a diagram showing a configuration of a pixel.

Next, specific structure of the unit pixel 50 arranged in a matrix in the pixel array part 41 of FIG. 1 will be described. FIG. 2 is a diagram showing an exemplary cross-sectional configuration of the pixel 50.

With a pixel 50a that shows FIG. 2, light leaking into a charge holding region 68 can be prevented, and generation of optical noise can be prevented. Moreover, with a pixel 50b shown in FIG. 4, light incidence (parasitic light sensitivity (PLS): phenomenon similar to a smear) on the charge holding region 68 can be further suppressed (influence by light incidence is reduced).

First, with reference to FIG. 2, a description is added to a structure of the pixel 50a having a structure that prevents light from leaking into the charge holding region 68.

As shown in FIG. 2, the pixel 50a has a configuration in which a wiring layer 61, an oxide film 62, a semiconductor substrate 63, a light shielding layer 64, a color filter layer 65, and an on-chip lens 66 are sequentially stacked from a lower side of FIG. 2. Furthermore, in the pixel 50a, a region in which a PD 51 is formed in the semiconductor substrate 63 is a PD region 67, and a region in which a charge holding part 54 is formed in the semiconductor substrate 63 is the charge holding region 68.

Note that the image sensor 30 is a so-called back-illuminated CMOS image sensor in which a back surface opposite to a front surface of the semiconductor substrate 63 where the wiring layer 61 is provided on the semiconductor substrate 63 (surface facing upward in FIG. 2) is irradiated with incident light.

The wiring layer 61 is, for example, supported by a substrate support (not shown) disposed thereunder, and has a configuration in which a plurality of wires 71 that performs processing such as reading a charge of the PD 51 formed in the semiconductor substrate 63 is embedded in an interlayer insulating film 72.

Furthermore, in the wiring layer 61, a TRX gate 73 constituting a transfer transistor is disposed below the semiconductor substrate 63 via the oxide film 62 in a region between the PD 51 and the charge holding part 54. In response to application of a predetermined voltage to the TRX gate 73, a charge accumulated in the PD 51 is transferred to the charge holding part 54.

The oxide film 62 has insulating properties and insulates a surface side of the semiconductor substrate 63. In the semiconductor substrate 63, an N-type region constituting the PD 51 and an N-type region constituting the charge holding part 54 are formed.

Furthermore, a surface pinning layer 74-1 is formed on a back side of the PD 51 and the charge holding part 54, and a surface pinning layer 74-2 is formed on a front side of the PD 51 and the charge holding part 54. Moreover, in the semiconductor substrate 63, an interpixel separation region 75 for separating the pixel 50a and another adjacent pixel 50a is formed so as to surround an outer periphery of the pixel 50a.

The light shielding layer 64 is formed by embedding a light shielding part 76 including a material having light shielding properties in a high dielectric constant material film 77. For example, the light shielding part 76 includes a material such as tungsten (W), aluminum (Al), or copper (Cu), and is connected to GND which is not shown. The high dielectric constant material film 77 includes a material such as silicon dioxide (SiO2), hafnium oxide (HfO2), tantalum pentoxide (Ta2O5), or zirconium dioxide (ZrO2).

Furthermore, the light shielding part 76 includes a lid part 76A disposed to cover the semiconductor substrate 63, and an embedded part 76B embedded in a vertical groove formed in the semiconductor substrate 63 to surround the PD 51 and the charge holding part 54. In other words, the lid part 76A is formed substantially in parallel to each layer constituting the pixel 50a, and the embedded part 76B is formed to a predetermined depth to extend in a direction substantially orthogonal to the lid part 76A.

Here, besides a configuration in which the embedded part 76B of the light shielding part 76 is formed in the interpixel separation region 75 to surround the PD 51 and the charge holding part 54, the embedded part 76B may have a configuration in which, for example, the embedded part 76B forms a periphery of the charge holding part 54 or a configuration in which the embedded part 76B is formed between the PD 51 and the charge holding part 54. In other words, it is required at least that the embedded part 76B is formed between the PD 51 and the charge holding part 54, and that the PD 51 and the charge holding part 54 are separated by the embedded part 76B.

Furthermore, in the light shielding part 76, an aperture 76C for allowing light to enter the PD 51 is formed. In other words, the aperture 76C is formed in a region corresponding to the PD 51, and other regions, for example, regions where the charge holding part 54, an FD 55, or the like are formed are shielded by the light shielding part 76.

Furthermore, in an example shown in FIG. 2, the light shielding part 76 is formed such that part of the embedded part 76B penetrates the semiconductor substrate 63. In other words, the light shielding part 76 is formed such that the embedded part 76B penetrates the semiconductor substrate 63 in a region except for the region between the PD 51 and the charge holding part 54, in other words, except for a region that serves as a transfer path for transferring a charge from the PD 51 to the charge holding part 54.

In other words, the light shielding part cannot formed in the region between the PD 51 and the charge holding part 54, which is used for charge transfer, but by forming the embedded part 76B outside the region, it is possible to effectively suppress light leaking into the charge holding part 54 from a region other than the PD 51 of the same pixel 50a.

In the following description, the light shielding part 76 is described as the penetrating light shielding part 76 so as to penetrate the semiconductor substrate 63, and the light shielding part 76 that does not penetrate the semiconductor substrate 63 is described as the non-penetrating light shielding part 76. In FIG. 2, the light shielding part 76 surrounding the pixel 50a is the penetrating light shielding part 76, and the light shielding part 76 formed between the PD 51 and the charge holding part 54 is the non-penetrating light shielding part 76. Furthermore, the penetrating light shielding part 76 is also non-penetrating in a place where a transistor is disposed or other places.

In the color filter layer 65, filters that transmit light of color corresponding to each pixel 50a are disposed, and for example, filters that transmit green, blue, and red light are disposed in the so-called Bayer array in each pixel 50a.

The on-chip lens 66 is a small lens for concentrating, on the PD 51, incident light incident on the pixel 50a.

As described above, the pixel 50a includes the light shielding part 76 in which the embedded part 76B is formed at least between the PD 51 and the charge holding part 54. With this configuration, as shown by hollow arrows in FIG. 2, even if light is incident from an oblique direction and passes through the PD 51, the light can be shielded by the embedded part 76B, and thus light leaking into the charge holding region 68 can be prevented. Therefore, generation of optical noise that is expected to be generated in a case where light leaks into the charge holding region 68 can be prevented.

<About Light Incident into Charge Holding Region>

With the pixel 50a shown in FIG. 2, since light that is incident in an oblique direction, passes through the PD 51, and enters the charge holding part 54 is shielded by the light shielding part 76, as described above, generation of optical noise that is expected to be generated in a case where light leaks into the charge holding region 68 can be prevented. Moreover, reducing an influence by the light reflected by the wiring layer 61 will be described.

Figure 3:
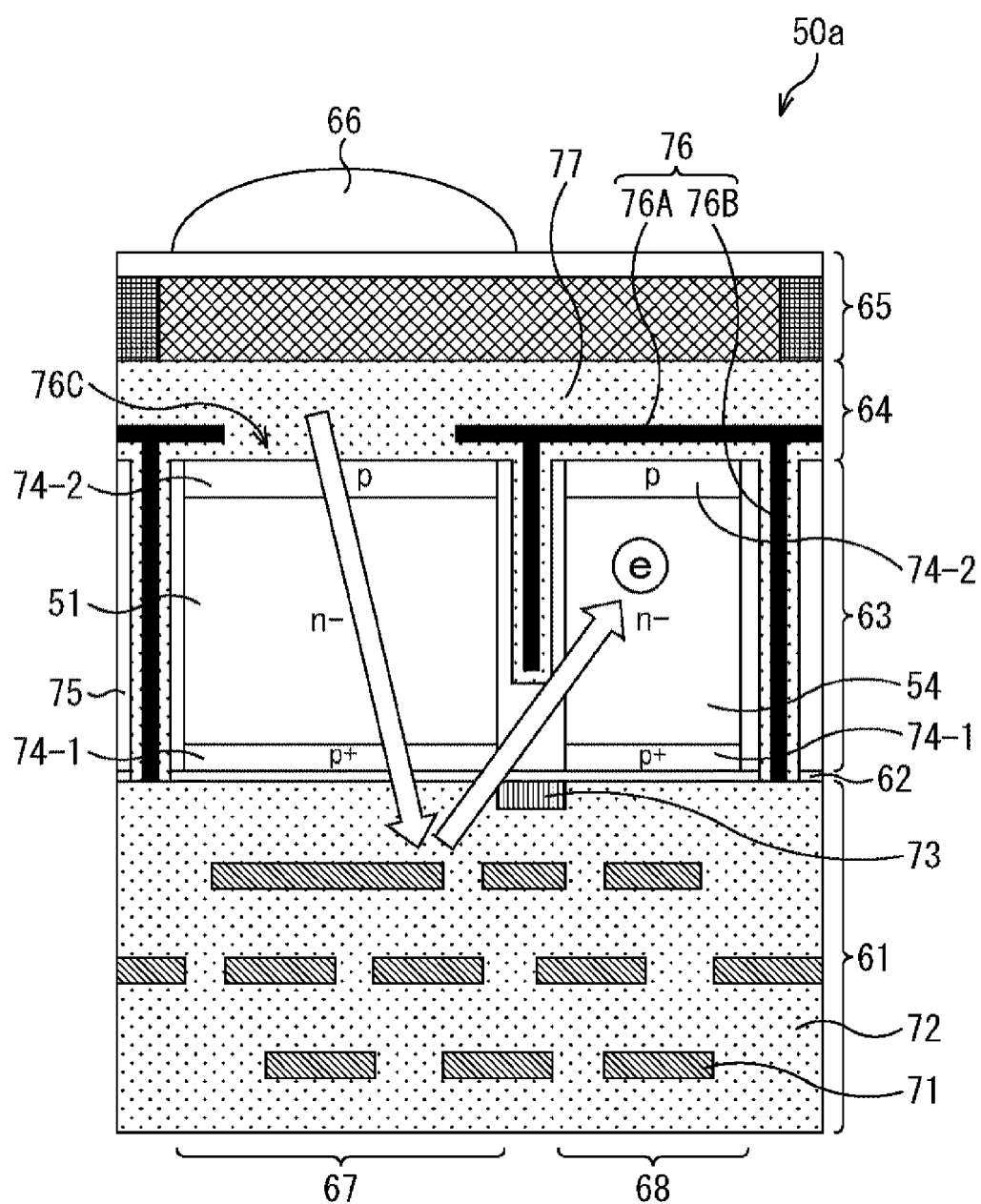
FIG. 3 is a diagram for describing an influence of reflected light.

FIG. 3 shows again the pixel 50a shown in FIG. 2. As shown by hollow arrows in FIG. 3, of the light incident into the PD 51, some light penetrates the PD 51 and reaches the wiring layer 61. Part of the light reaching the wiring layer 61 is reflected by the wires 71 and incident into the charge holding part 54. Thus, there is a possibility that light is incident into the charge holding part 54 not only from a PD 51 side but also from a wiring layer 61 side.

The configuration of the pixel 50 for reducing an influence of a light component from the wiring layer 61 side in order to further suppress generation of optical noise that is expected to be generated in a case where light leaks into the charge holding region 68 will be described.

<Configuration of Charge Holding Part>

Figure 4:
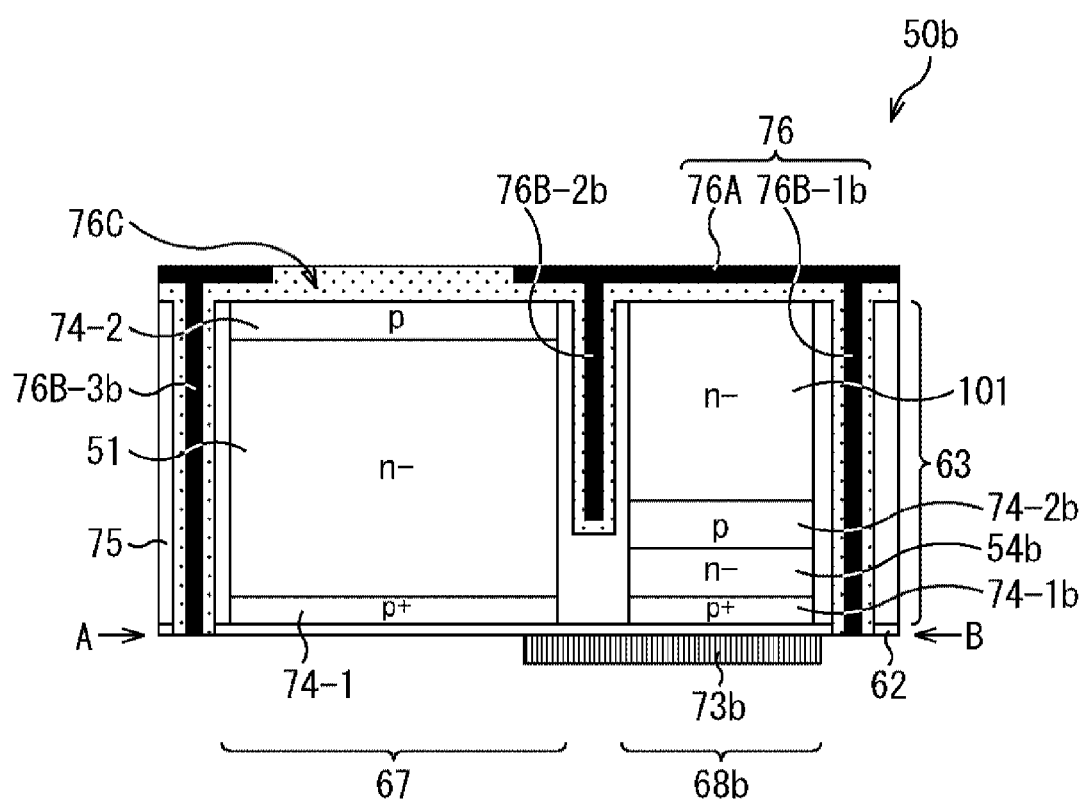
FIG. 4 is a diagram showing a configuration of one embodiment of a pixel to which the present technology is applied.

FIG. 4 is a diagram showing another configuration of the pixel 50. Regarding the diagrams of the pixel 50 in FIG. 4 and thereafter, illustration of the wiring layer 61, the light shielding layer 64, the color filter layer 65, and the on-chip lens 66 will be omitted.

When the pixel 50b shown in FIG. 4 is compared with the pixel 50a shown in FIG. 2, the configuration of the charge holding region 68 is different. The charge holding region 68b of the pixel 50b includes a surface pinning layer 74-1b, a charge holding part 54b, and a surface pinning layer 74-2b in a similar manner to the pixel 50a shown in FIG. 2, but a thickness of each layer, in particular, the charge holding part 54b is thin.

Furthermore, a charge capturing region 101 being formed in an upper portion of the charge holding region 68b (incident side, upper portion of the surface pinning layer 74-2b) also differs from the pixel 50a shown in FIG. 2. This charge capturing region 101 is formed as n-type.

With reference to FIG. 3 again, there is a strong possibility that the light reflected by the wiring layer 61 reaches an upper portion of the charge holding region 68 (upper side in the diagram), in other words, an upper portion of the charge holding part 54 (side not on the wiring layer 61 side), and is subjected to photoelectric conversion. Therefore, as shown in FIG. 4, a structure is used in which the charge capturing region 101 is provided in an upper portion of the charge holding region 68 separately from the charge holding part 54b, and this charge capturing region 101 captures the light reflected by the wiring layer 61.

Such a structure allows the charge capturing region 101 to capture the light reflected by the wiring layer 61, and can prevent generation of optical noise that is expected to be generated in a case where light leaks into the charge holding region 68.

Figure 5:
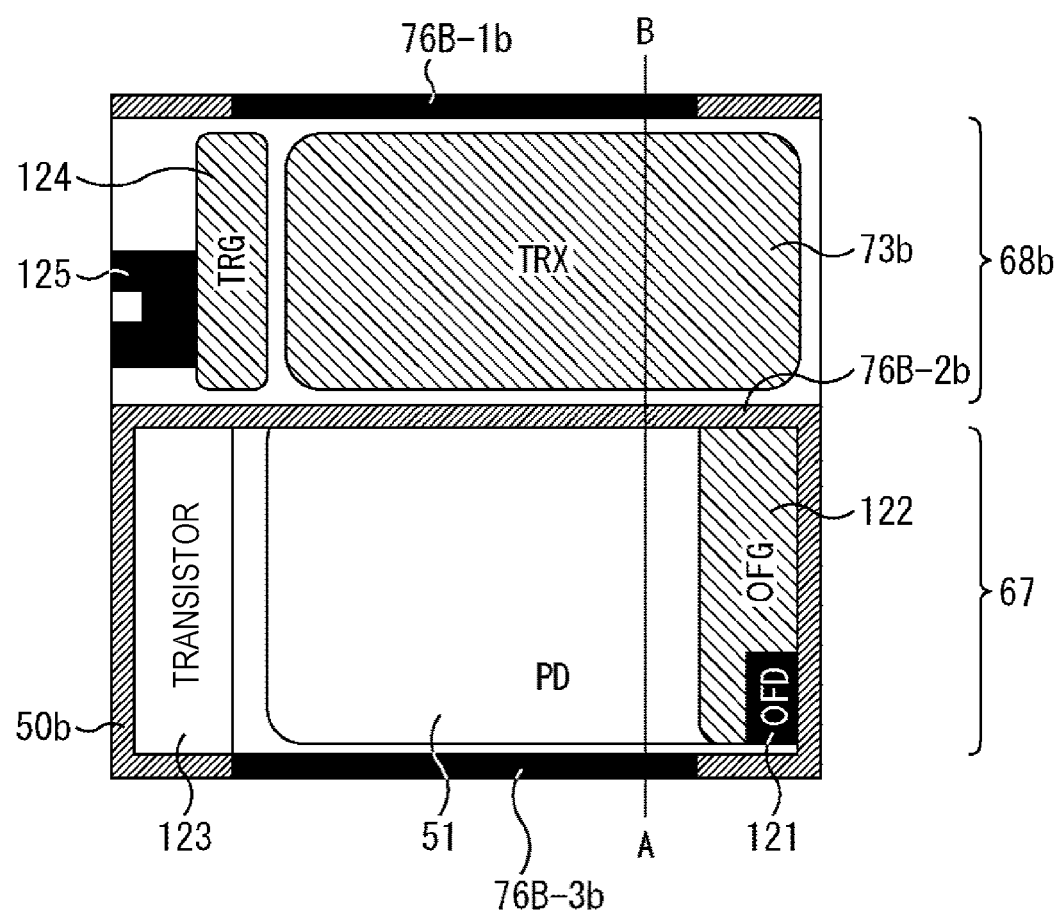
FIG. 5 is a plan view showing the configuration of the pixel.

FIG. 5 is a plan view of the pixel 50b shown in FIG. 4 when viewed from below (lower side in FIG. 4). The pixel 50b shown in FIG. 4 is an exemplary cross-sectional configuration of the pixel 50b in the cross section of arrow A-B shown in FIG. 5.

An OFD 121 is positioned at the lower right in the diagram. The OFD 121 represents a drain connected to a reset gate of the PD 51. The OFD 121 is connected to the PD 51 via an OFG gate 122.

The charge holding region 68b is disposed on an upper side of the PD 51. When the pixel 50b is viewed from below, a TRX gate 73b is disposed in a region where the charge holding region 68b (charge holding part 54b) is disposed. The TRX gate 73b is provided to transfer a charge from the PD 51 to the charge holding part 54b.

A floating diffusion region 125 (FD 125) is disposed on a left side of the charge holding region 68b in the diagram via the TRX gate 73b. A TRG gate 124 is provided to transfer a charge from the charge holding part 54b to the floating diffusion region 125.

The penetrating light shielding part 76 (penetrating light shielding part 76B-1b) is formed in an upper portion of the charge holding region 68b. Both ends of this penetrating light shielding part 76B-1b are partially formed in a non-penetrating manner because a transistor or the like is disposed.

The PD region 67 is surrounded by a non-penetrating light shielding part 76B-2b and a penetrating light shielding part 76B-3b. The penetrating light shielding part 76B-3b is a light shielding part provided between the pixels 50b and is the same as the penetrating light shielding part 76B-1b although denoted with a different reference symbol for convenience of description.

Between the pixels 50b, light leaking between the pixels is shielded by the penetrating light shielding parts 76B-1b and 76B-3b.

Between the PD region 67 (PD 51) and the charge holding region 68b (charge holding part 54b), light leaking from the PD 51 side to the charge holding part 54b is shielded by the non-penetrating light shielding part 76B-2b.

Moreover, as described with reference to FIG. 4, the pixel 50b has a configuration in which the reflected light from the wiring layer 61 side is captured by the charge capturing region 101. With such a configuration, the pixel 50b can suppress generation of optical noise.

As described above, in a case where the charge holding region 68b is provided with the charge capturing region 101, the charge capturing region 101 can suppress PLS more by, for example, satisfying conditions to be described with reference to FIG. 6.

Figure 6:
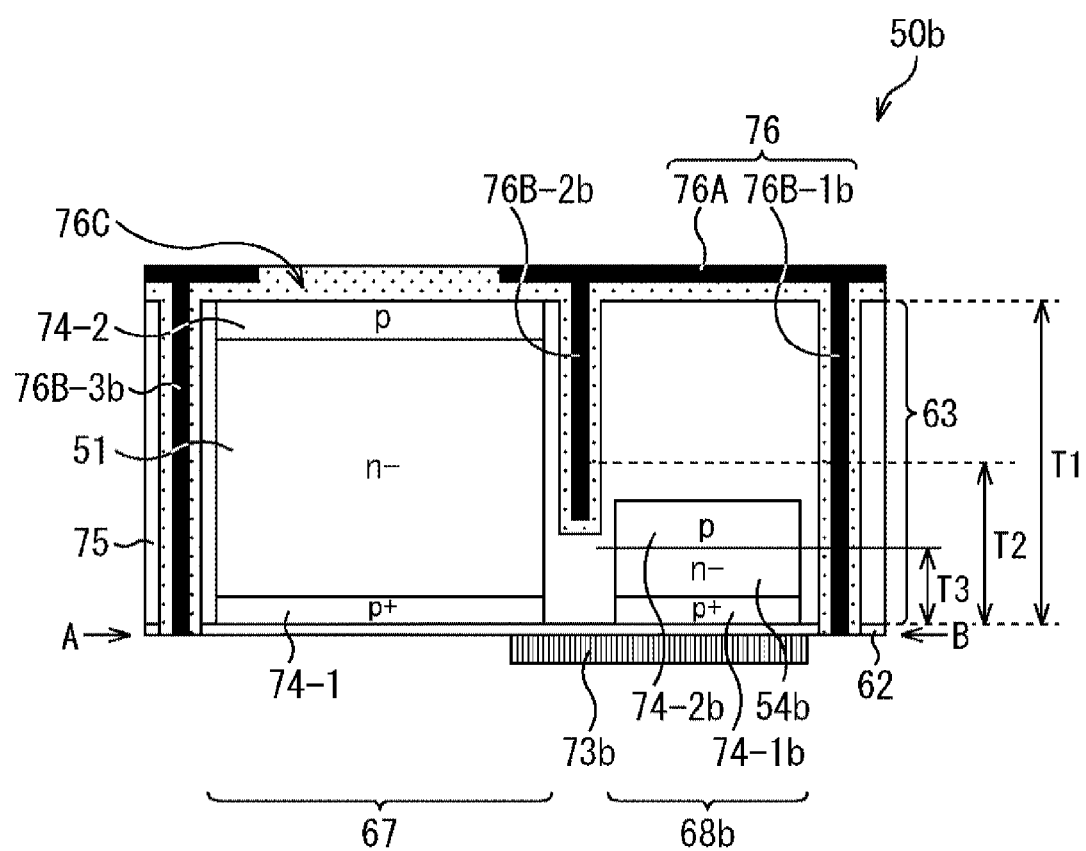
FIG. 6 is a diagram for describing a thickness of a charge holding region.

With reference to FIG. 6, it is assumed that a thickness of the semiconductor substrate 63 is a thickness T1, and a half thickness thereof is a thickness T2. It is assumed that the thickness of the charge holding part 54b and the pinning layer 74-1b is a thickness T3. The charge holding part 54b and the pinning layer 74-1b function as a holding region for holding a charge (memory), and the thickness T3 of this memory is formed to be equal to or less than the thickness T2 that is half the thickness of the semiconductor substrate 63.

Thus, PLS can be suppressed by only forming the thickness T3 of the charge holding part 54b and the pinning layer 74-1b to be equal to or less than the thickness T2 that is half the thickness of the semiconductor substrate 63.

In other words, with a configuration in which a photoelectric conversion part (PD 51), which converts received light into a charge, and a holding part (charge holding part 54), which holds a charge transferred from the photoelectric conversion part, are formed in the semiconductor substrate 63, and the thickness of the holding part is set half or less of the thickness of the semiconductor substrate 63, the imaging device can suppress PLS.

Moreover, by setting the thickness of the charge holding part 54b and the pinning layer 74-1b to T3, the charge capturing region 101 (FIG. 4) can be formed in a region of the semiconductor substrate 63 (thickness T1 to thickness T3) (region on the light incident side). As described above, by forming the charge capturing region 101, it is possible to prevent a reflected component from entering the charge holding part 54b, and it becomes possible to suppress PLS more.

<Still Other Configurations of Pixel>

Still other configurations of the pixel 50 including the charge capturing region 101 will be described. Note that the same parts as the pixel 50b shown in FIG. 4 and FIG. 5 are denoted with the same reference symbols, and the description thereof is omitted.

Figure 7:
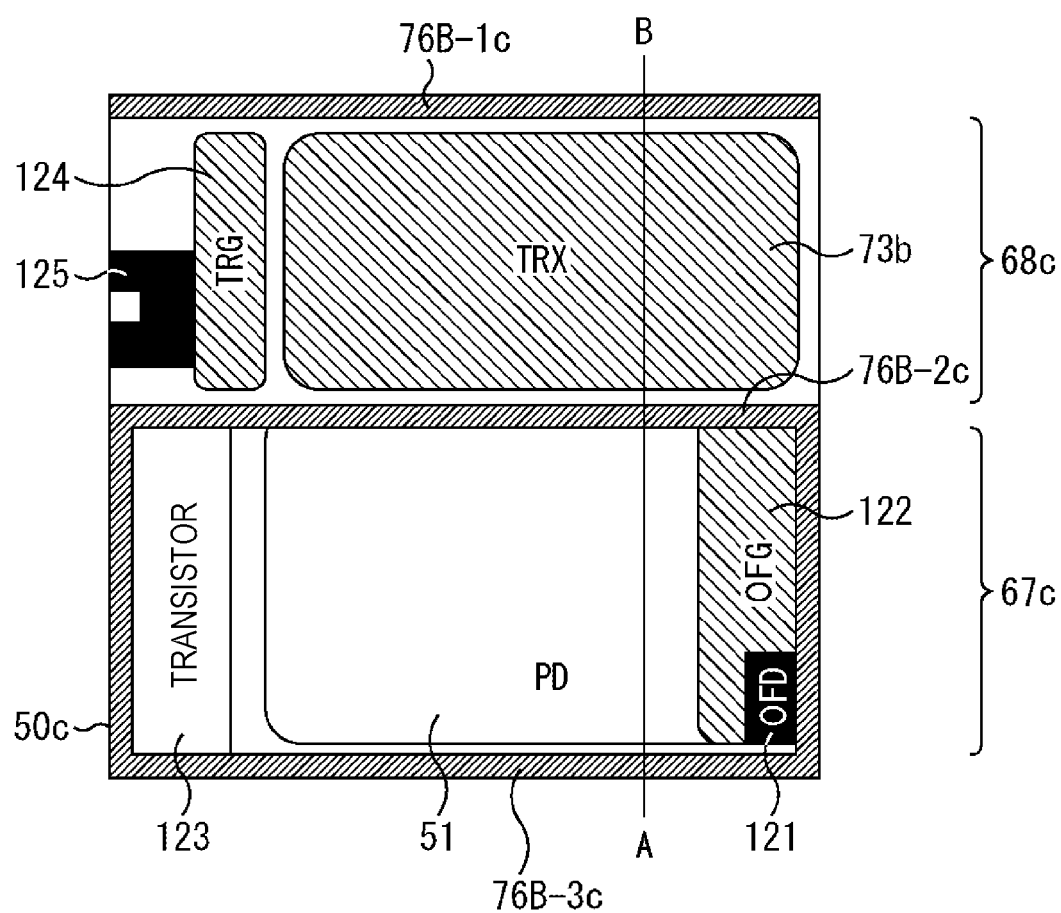
FIG. 7 is a plan view showing another configuration of the pixel.
Figure 8:
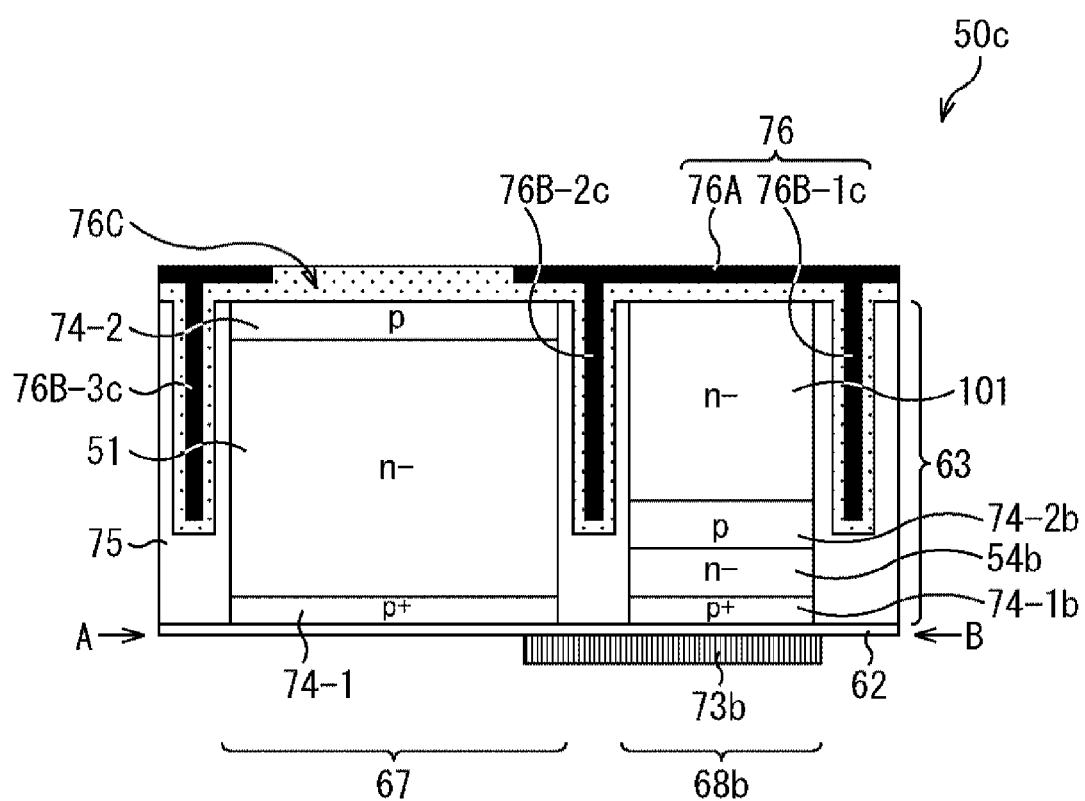
FIG. 8 is a cross-sectional view showing another configuration of the pixel.

FIG. 7 is a plan view of a pixel 50c, and FIG. 8 is a cross-sectional view of the pixel 50c in the cross section of arrow A-B shown in FIG. 7.

On comparison, the pixel 50c shown in FIG. 7 and FIG. 8 differs from the pixel 50b shown in FIG. 4 and FIG. 5 in that in the pixel 50c, the light shielding part 76 between the pixels 50 is formed as the non-penetrating light shielding part 76, and other parts are the same.

In other words, with reference to FIG. 7 and FIG. 8, the light shielding part 76 formed between the adjacent pixels 50c is a non-penetrating light shielding part 76B-1c and a non-penetrating light shielding part 76B-3c. The light shielding part 76 between the PD region 67c and the charge holding region 68c is also a non-penetrating light shielding part 76B-2c.

Thus, by making the light shielding part 76 the non-penetration light shielding part, the number of processes for forming the light shielding part can be reduced. Furthermore, it is unnecessary to ensure the P type of a digging portion forming the light shielding part 76, and it is also possible to increase the amount of saturated electrons.

Figure 9:
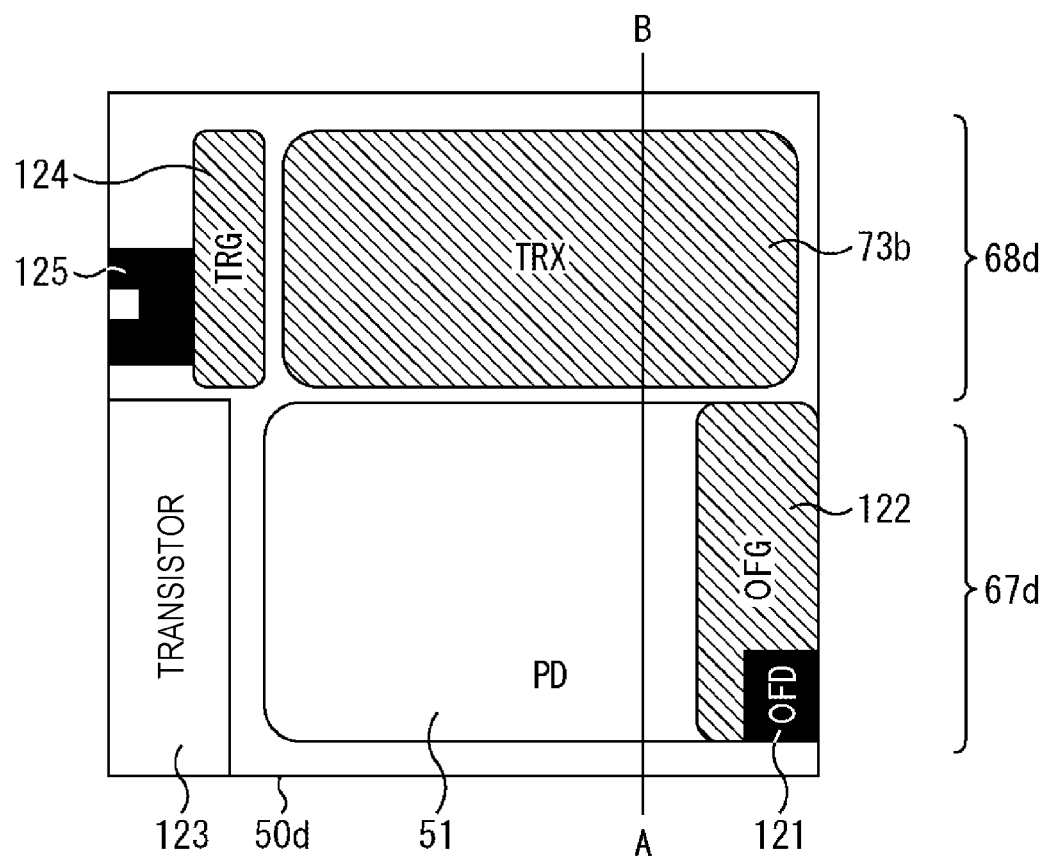
FIG. 9 is a plan view showing another configuration of the pixel.

Still other configurations of the pixel 50 will be described. FIG. 9 is a plan view of a pixel 50d, and FIG. 10 is a cross-sectional view of the pixel 50d in the cross section of arrow A-B shown in FIG. 9.

Figure 10:
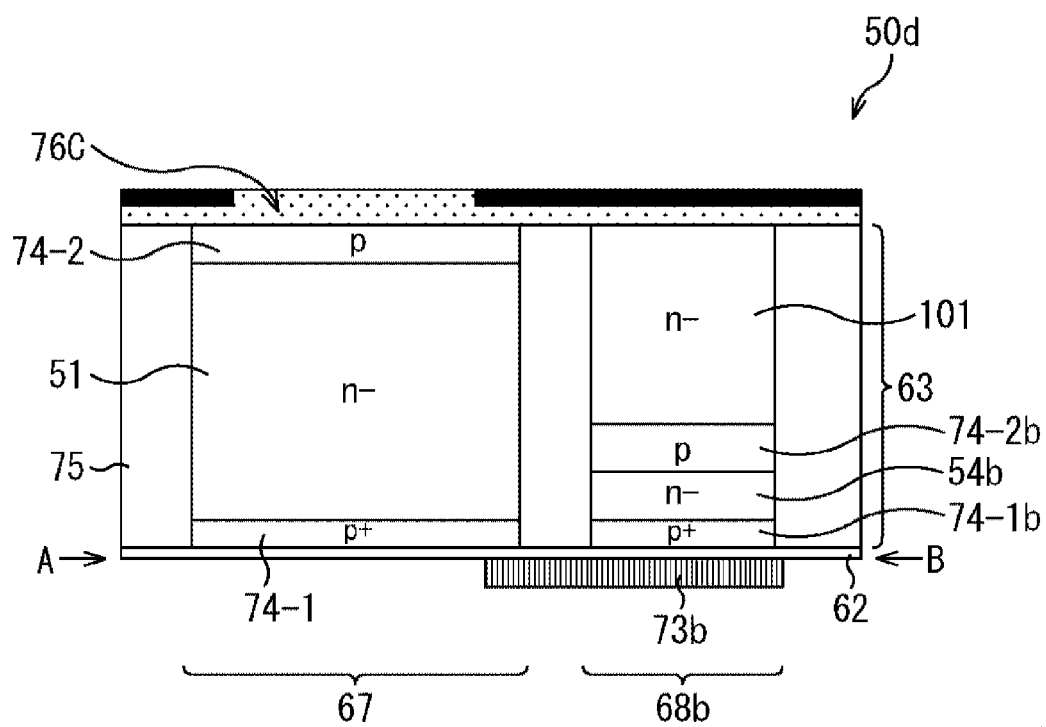
FIG. 10 is a cross-sectional view showing another configuration of the pixel.

On comparison, the pixel 50d shown in FIG. 9 and FIG. 10 differs from the pixel 50b shown in FIG. 4 and FIG. 5 in that the light shielding part 76 between the pixels 50 and the light shielding part 76 between the PD region 67c and the charge holding region 68c are not formed in the pixel 50d, and other parts are the same.

In other words, with reference to FIG. 9 and FIG. 10, the light shielding part 76 is not formed between the adjacent pixels 50d. Furthermore, the light shielding part 76 is not formed between the PD region 67c and the charge holding region 68c as well.

Even with such a configuration, as described with reference to FIG. 6, by forming the thickness of the charge holding part 54d (memory thickness) at half or less the thickness of the semiconductor substrate 63, PLS can be suppressed, and moreover, since the charge capturing region 101 can capture not only the reflected component but also the light component that has passed through the PD 51, PLS can be suppressed.

Thus, with the configuration in which the vertical light shielding part 76 is not formed, the number of processes for forming the light shielding part can be reduced. Furthermore, it is unnecessary to ensure the P type of a digging portion forming the light shielding part 76, and it is also possible to increase the amount of saturated electrons.

<Configuration with Discharge Drain>

As described above, by forming the charge capturing region 101 above the charge holding part 54, it is possible to capture a charge caused by the light passing through the PD 51 or the light reflected by the wiring layer 61, but since such unnecessary electrons are accumulated in the charge capturing region 101, it is preferable to provide a mechanism for discharge.

In the following, a description will be added to the pixel 50 including a discharge drain that discharges the charge accumulated in the charge capturing region 101.

In the following description, the pixel 50b shown in FIG. 4 and FIG. 5 is described as an example, but the discharge drain can be similarly formed in other pixels. Note that the same parts as the pixel 50b shown in FIG. 4 and FIG. 5 are denoted with the same reference symbols, and the description thereof is omitted.

Figure 11:
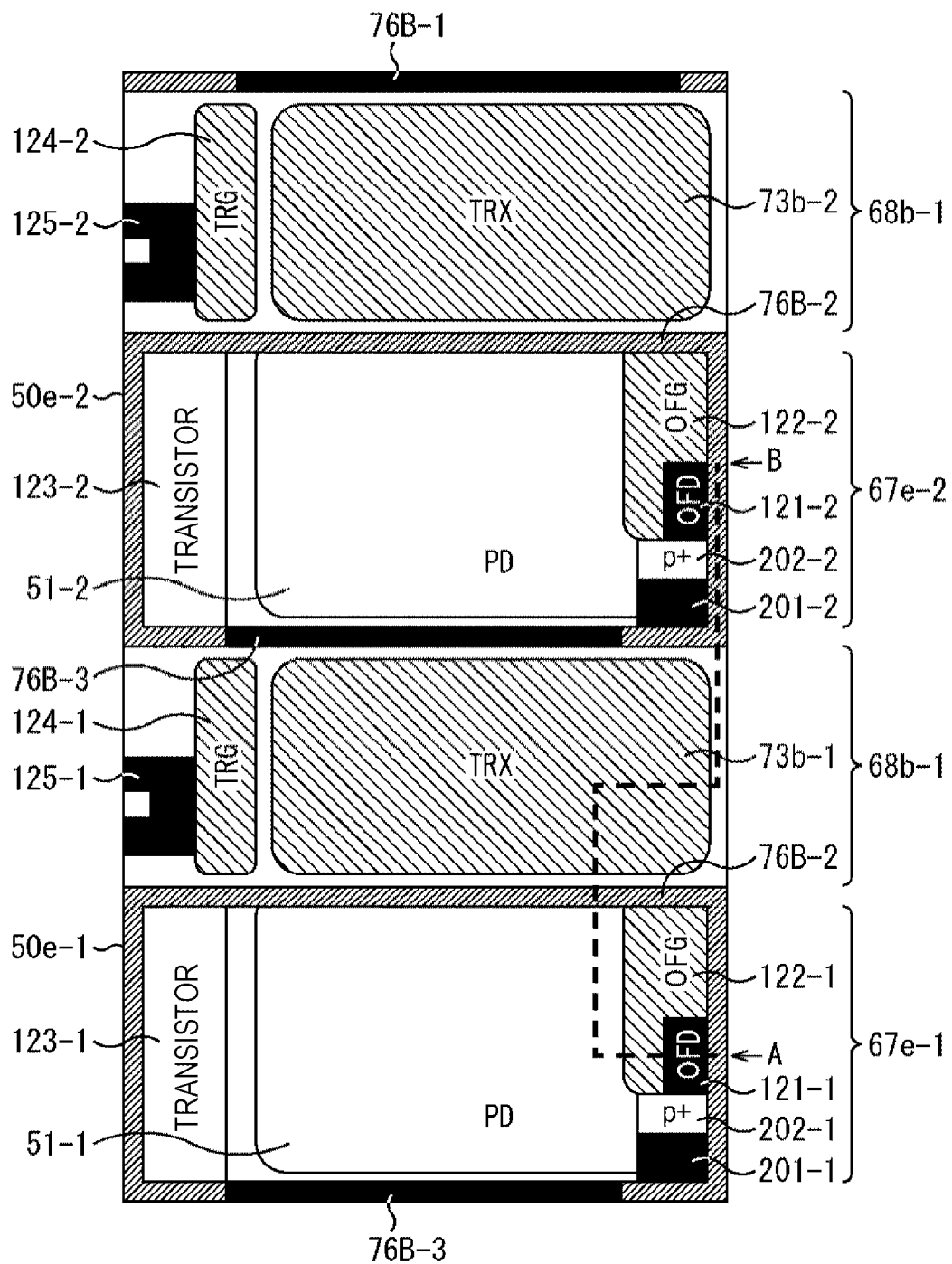
FIG. 11 is a plan view showing another configuration of the pixel.
Figure 12:
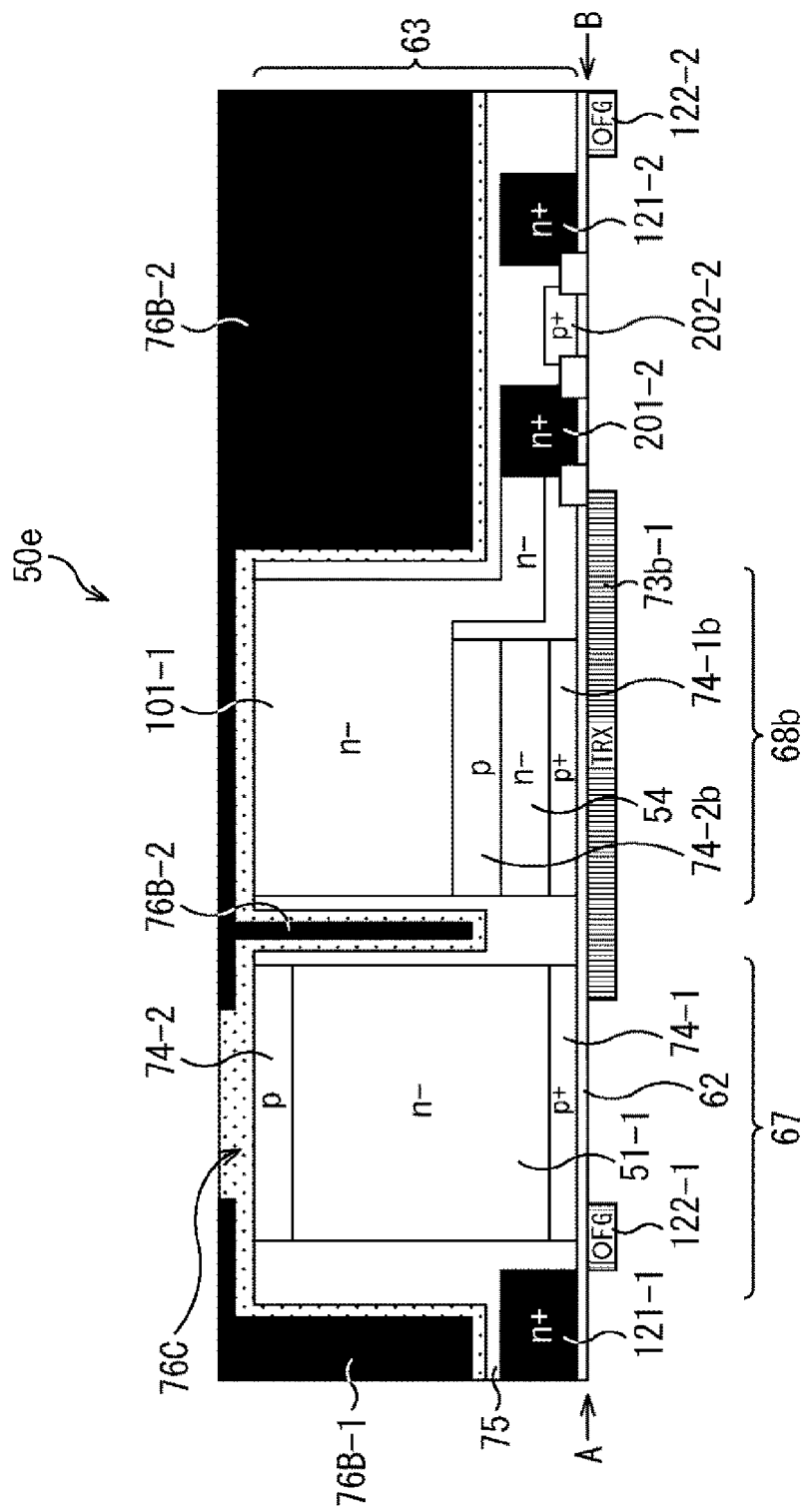
FIG. 12 is a cross-sectional view showing another configuration of the pixel.

FIG. 11 is a plan view of vertically disposed two pixels 50e, and FIG. 12 is a cross-sectional view of the pixel 50e in the cross section of arrow A-B shown in FIG. 11.

With reference to FIG. 11, a discharge drain 201-1 is disposed at a lower right of a PD region 67e-1 of a pixel 50e-1 and near an OFD 121-1 in the diagram. In order to separate the OFD 121-1 and the discharge drain 201-1, a p+ region 202-1 is formed between the OFD 121-1 and the discharge drain 201-1.

Similarly, a discharge drain 201-2 is disposed at a lower right of the PD region 67 of a pixel 50e-2 and near an OFD 121-2. In order to separate the OFD 121-2 and the discharge drain 201-2, a p+ region 202-2 is formed between the OFD 121-2 and the discharge drain 201-2.

Thus, the discharge drain 201 is provided in each pixel 50e in the configuration.

As shown in FIG. 12, the discharge drain 201-2 is connected to a charge capturing region 101-1. Thus, with the configuration in which the discharge drain 201 is provided and the charge capturing region 101 is connected to the discharge drain 201, the charge accumulated in the charge capturing region 101 overflows and is discharged from the discharge drain 201.

Furthermore, an overflow path from the charge capturing region 101 to the discharge drain 201 can be formed below the non-penetrating light shielding part.

The charge capturing region 101-1 is formed in the pixel 50e-1, and the discharge drain 201-2 to which the charge capturing region 101-1 is connected is formed in the pixel 50e-2 adjacent to the pixel 50e-1.

As in this example, the charge capturing region 101 can be connected to the discharge drain 201 formed in the adjacent pixel 50e. Furthermore, although not shown, the charge capturing region 101 may be connected to the discharge drain 201 formed in the pixel 50e in which the charge capturing region 101 is formed.

Meanwhile, when the light shielding part 76 has been described with reference to FIG. 5, the description has been provided that part of the penetrating light shielding part 76 is partially non-penetrating in order to dispose a transistor and the like.

The light shielding part 76 disposed between the pixels 50e shown in FIG. 12 corresponds to, for example, the penetrating light shielding part 76B-1 described with reference to FIG. 5. The light shielding part 76, which is the penetrating light shielding part 76B-1, penetrates the semiconductor substrate 63, but the cross-sectional view shown in FIG. 12 shows a cross-section of a portion where the OFD 121-1 is disposed, resulting in that the light shielding part 76 is non-penetrating.

Furthermore, the light shielding part 76 above the discharge drain 201-2 shown in FIG. 12 corresponds to, for example, the non-penetrating light shielding part 76B-2 surrounding the PD 51 described with reference to FIG. 5. In the example shown in FIG. 12, the discharge drain 201-2, the p+ region 202-2, the OFD 121-1, and the like are disposed on a lower side of the non-penetrating light shielding part 76B-2 and therefore the light shielding part 76 is non-penetrating.

Figure 13:
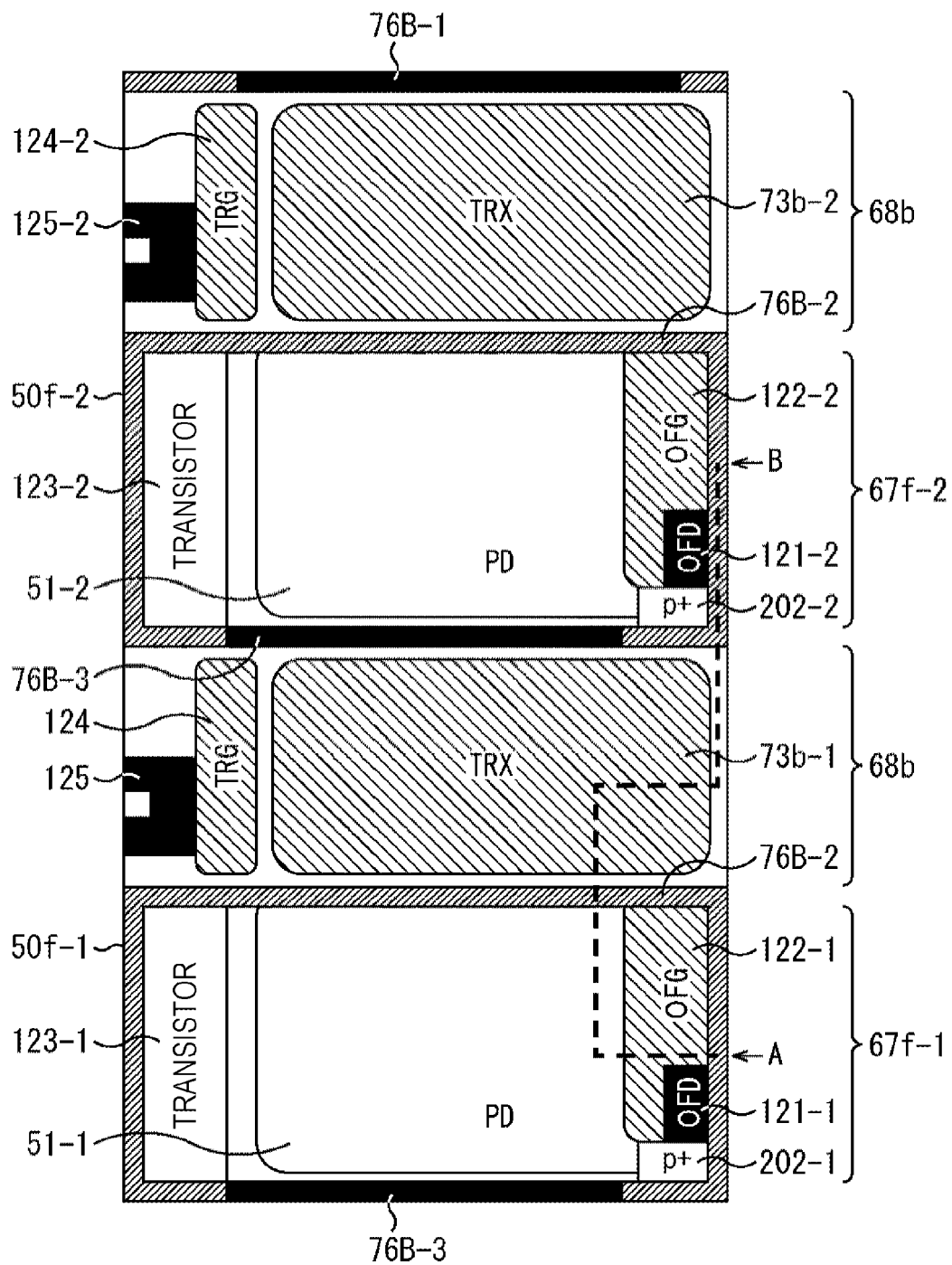
FIG. 13 is a plan view showing another configuration of the pixel.
Figure 14:
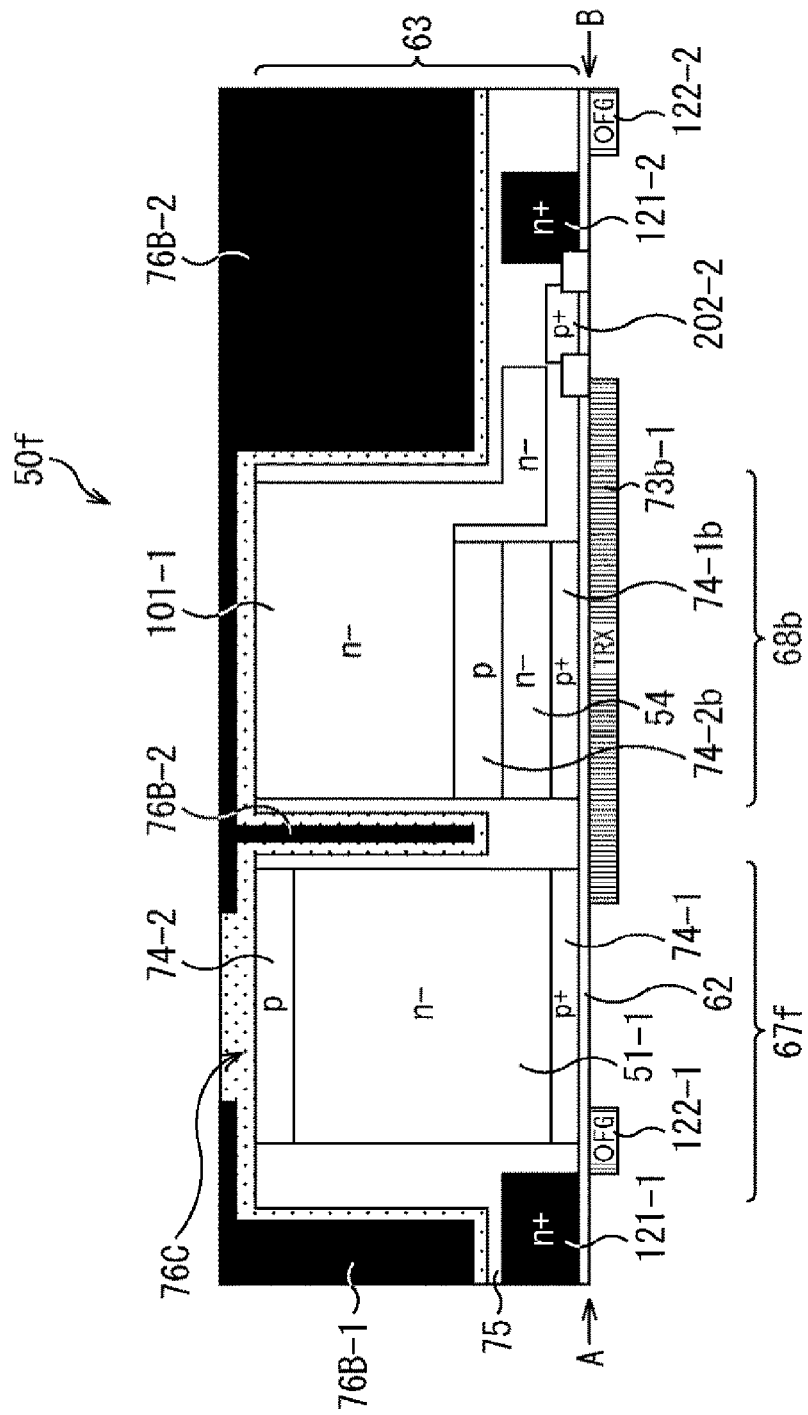
FIG. 14 is a cross-sectional view showing another configuration of the pixel.

With reference to FIG. 13 and FIG. 14, another configuration of the pixel 50 including the discharge drain will be described.

A pixel 50f shown in FIG. 13 and FIG. 14 has a configuration in which the discharge drain is shared with the OFD 121. Because of the configuration in which the discharge drain and the OFD 121 are shared, the pixel 50f shown in FIG. 13 and FIG. 14 has a configuration in which the discharge drain 201 is deleted from the pixel 50e shown in FIG. 11 and FIG. 12.

The pixel 50f shown in FIG. 13 and FIG. 14 has a configuration in which the charge capturing region 101-1 of a pixel 50f-1 (formed under a TRX gate 73b-1) and the OFD 121 formed in a pixel 50f-2 are connected.

Thus, the charge capturing region 101 can be connected to the OFD 121 formed in the adjacent pixel 50f. Furthermore, although not shown, the charge capturing region 101 may be connected to the OFD 121 formed in the pixel 50f in which the charge capturing region 101 is formed.

Thus, with a configuration in which the OFD 121 is used also as a discharge drain that discharges the charge accumulated in the charge capturing region 101, as described with reference to FIG. 11 and FIG. 12, compared with the configuration in which the discharge drain 201 is provided separately from the OFD 121, it is possible to discharge the charge accumulated in the charge capturing region 101 without adding a new element such as the discharge drain 201.

Accordingly, sizes of the PD 51 and the OFG gate 122 do not need to be reduced, the charge accumulated in the charge capturing region 101 can be discharged, and area efficiency can be improved.

Figure 15:
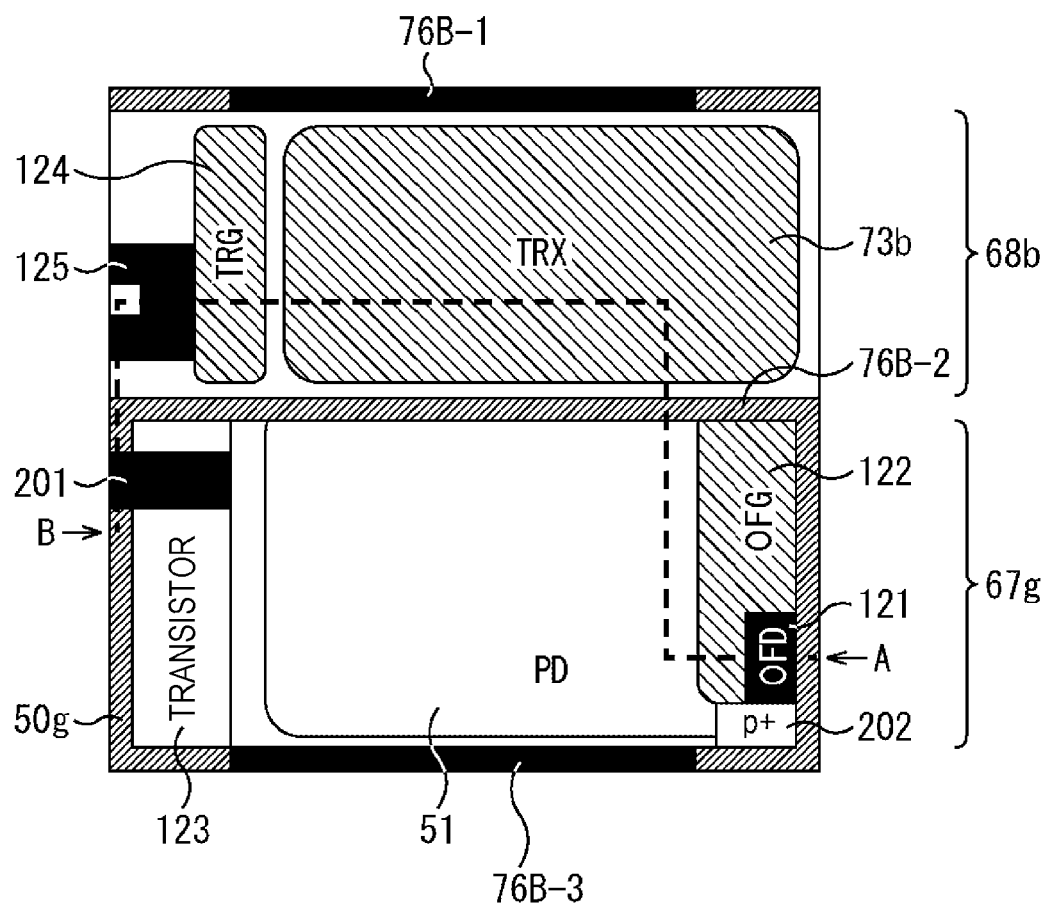
FIG. 15 is a plan view showing another configuration of the pixel.
Figure 16:
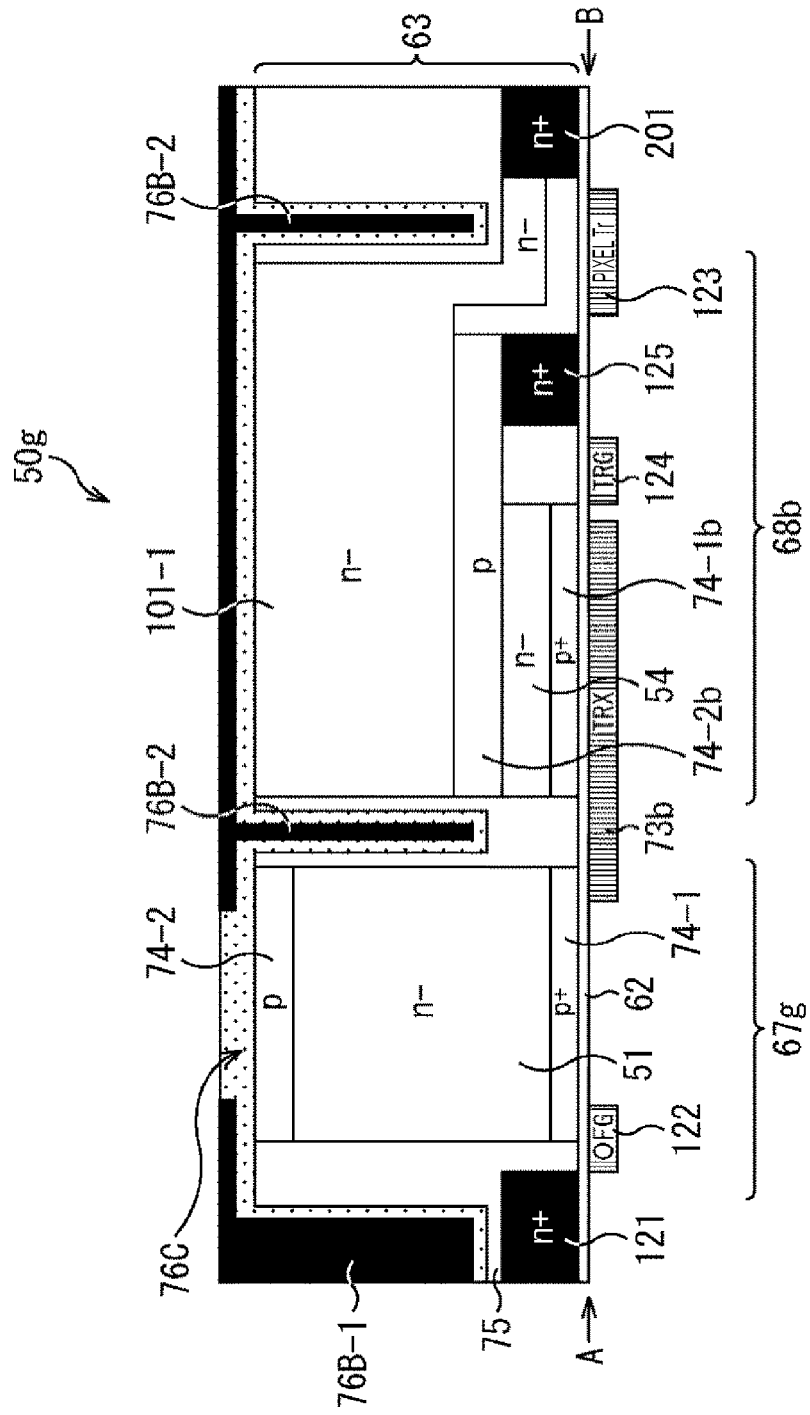
FIG. 16 is a cross-sectional view showing another configuration of the pixel.

With reference to FIG. 15 and FIG. 16, another configuration of the pixel 50 including the discharge drain will be described.

A pixel 50g shown in FIG. 15 and FIG. 16 has a configuration in which the discharge drain 201 is shared with the power source VDD of the transistor 123. Furthermore, the configuration is self-sufficient in one pixel 50g. In other words, the charge capturing region 101 and the discharge drain 201 are each formed in the same pixel 50g.

In the pixel 50g shown in FIG. 15 and FIG. 16, the power source VDD of the transistor 123 is the discharge drain 201, and the charge capturing region 101 is connected to the discharge drain 201.

Figure 17:
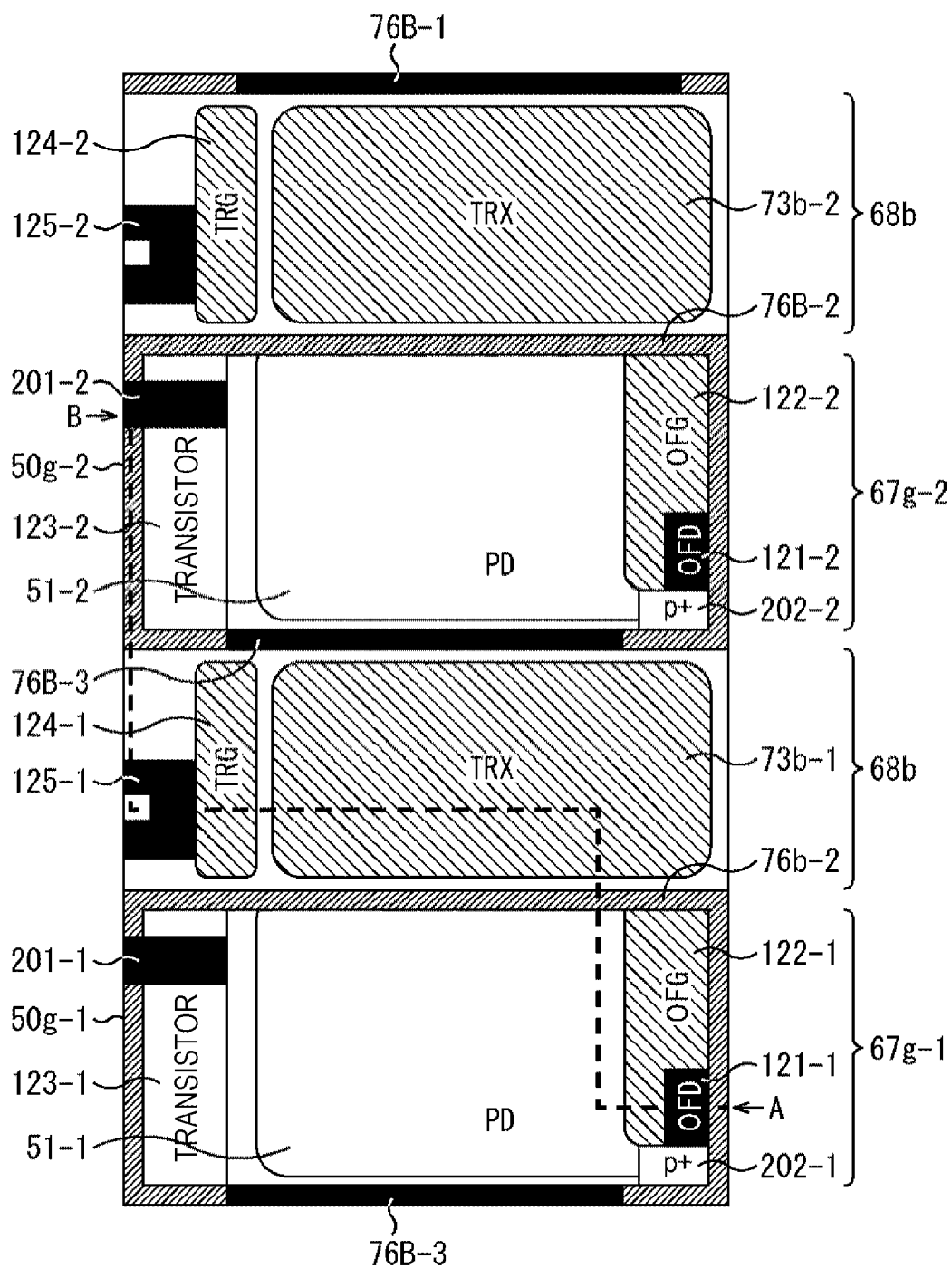
FIG. 17 is a plan view showing another configuration of the pixel.

Thus, the charge capturing region 101 can be connected to the transistor 123 (power source VDD therein) formed in the same pixel 50g. Furthermore, as in the example described above, as shown in FIG. 17, the charge capturing region 101-1 may be connected to (the power source VDD in) the transistor 123-2 formed in the pixel 50b-2 adjacent to the pixel 50b-1 in which the charge capturing region 101-1 is formed.

Thus, with the configuration in which the power source VDD of the transistor 123 is the discharge drain 201 and is also used as the discharge drain that discharges the charge accumulated in the charge capturing region 101, as in the case described with reference to FIG. 13 and FIG. 14, the charge accumulated in the charge capturing region 101 can be discharged without securing a region for disposing a new element, the discharge drain 201.

Accordingly, sizes of the PD 51 and the OFG gate 122 do not need to be reduced, the charge accumulated in the charge capturing region 101 can be discharged, and area efficiency can be improved.

Figure 18:
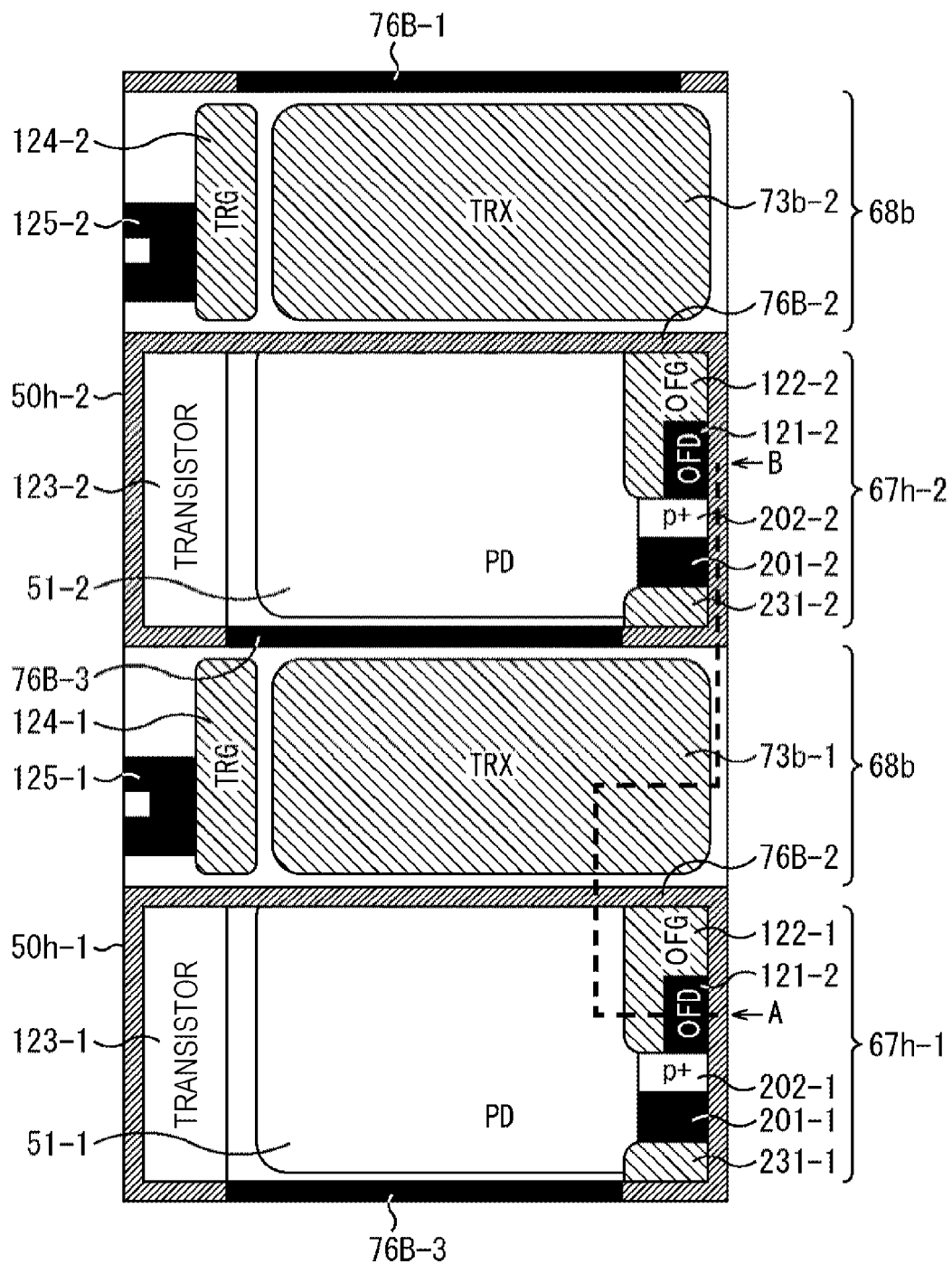
FIG. 18 is a plan view showing another configuration of the pixel.
Figure 19:
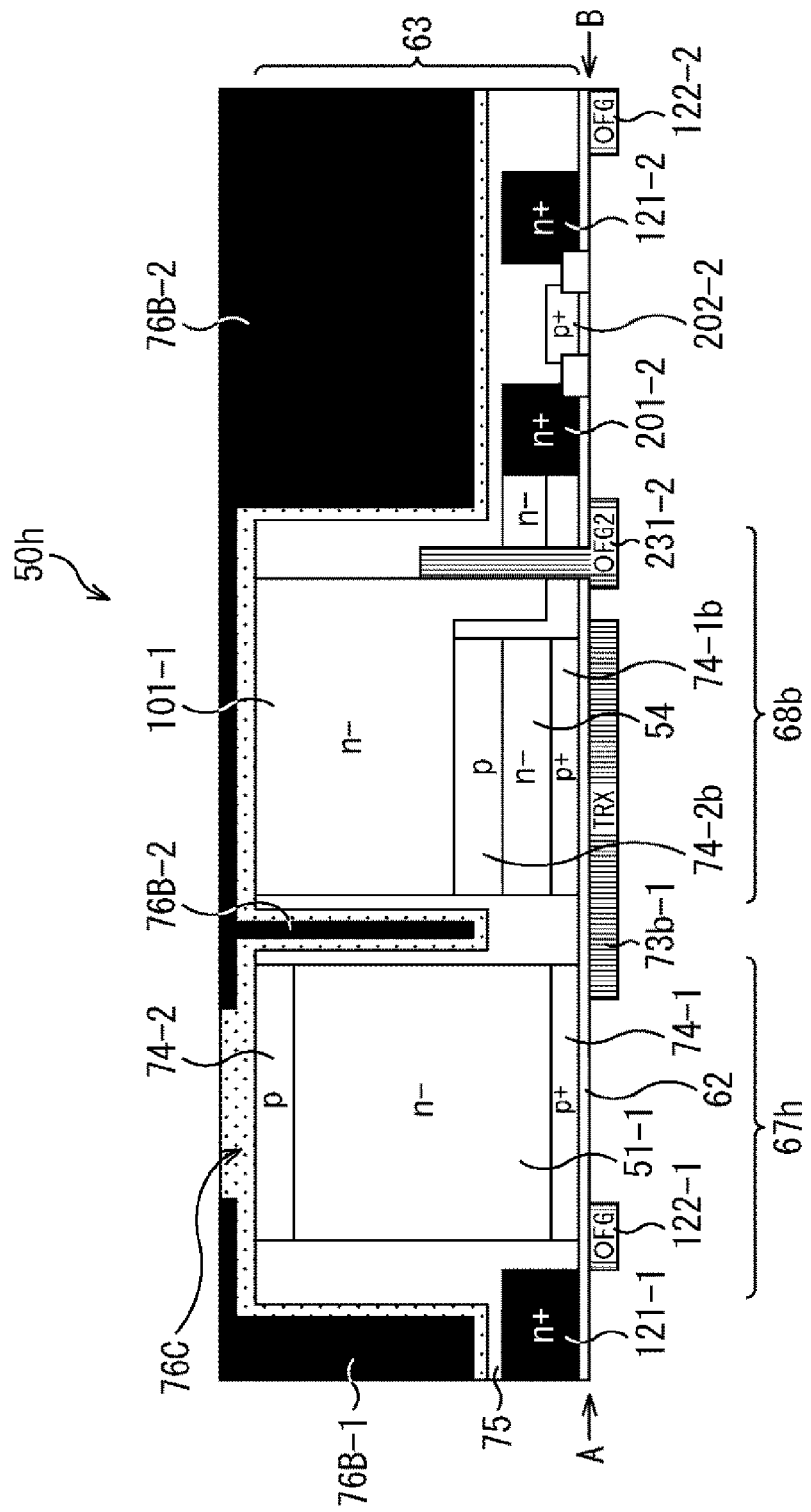
FIG. 19 is a cross-sectional view showing another configuration of the pixel.

With reference to FIG. 18 and FIG. 19, another configuration of the pixel 50 including the discharge drain will be described.

A pixel 50h shown in FIG. 18 and FIG. 19 includes the discharge drain 201 and an OFG gate 231 for the discharge drain 201. The pixel 50h shown in FIG. 18 and FIG. 19 has a configuration in which the OFG gate 231 is added to the pixel 50h shown in FIG. 11 and FIG. 12.

Thus, in a case of the pixel 50h including the OFG gate 231 dedicated to the discharge drain 201, the charge captured by the charge capturing region 101 is discharged by gate (Gate) control of the OFG gate 231.

The gate control of the OFG gate 231 is to read a PLS signal. In other words, the gate control of the OFG gate 231 is to read a signal from the charge capturing region 101.

The PLS signal read from the charge capturing region 101 may be used for signal processing in subsequent stages. Since the charge accumulated in the charge capturing region 101 is considered to depend on intensity of incident light in the same manner as the charge accumulated in the PD 51, for example, it is also possible to perform processing such as to measure the intensity of light with a signal from the charge capturing region 101, and to use processing according to the measurement result for processing the signal read from the PD 51.

The charge capturing region 101-1 is formed in a pixel 50h-1, and the discharge drain 201-2 and an OFG gate 231-2 to which the charge capturing region 101-1 is connected are formed in a pixel 50h-2 adjacent to the pixel 50h-1.

As in this example, the charge capturing region 101 can be connected to the discharge drain 201 and the OFG gate 231 formed in the adjacent pixel 50h. Furthermore, although not shown, the charge capturing region 101 may be connected to the discharge drain 201 or the OFG gate 231 formed in the pixel 50h in which the charge capturing region 101 is formed.

The present technology makes it possible to reduce the influence of unnecessary light components.

<About Manufacturing>

Figure 20:
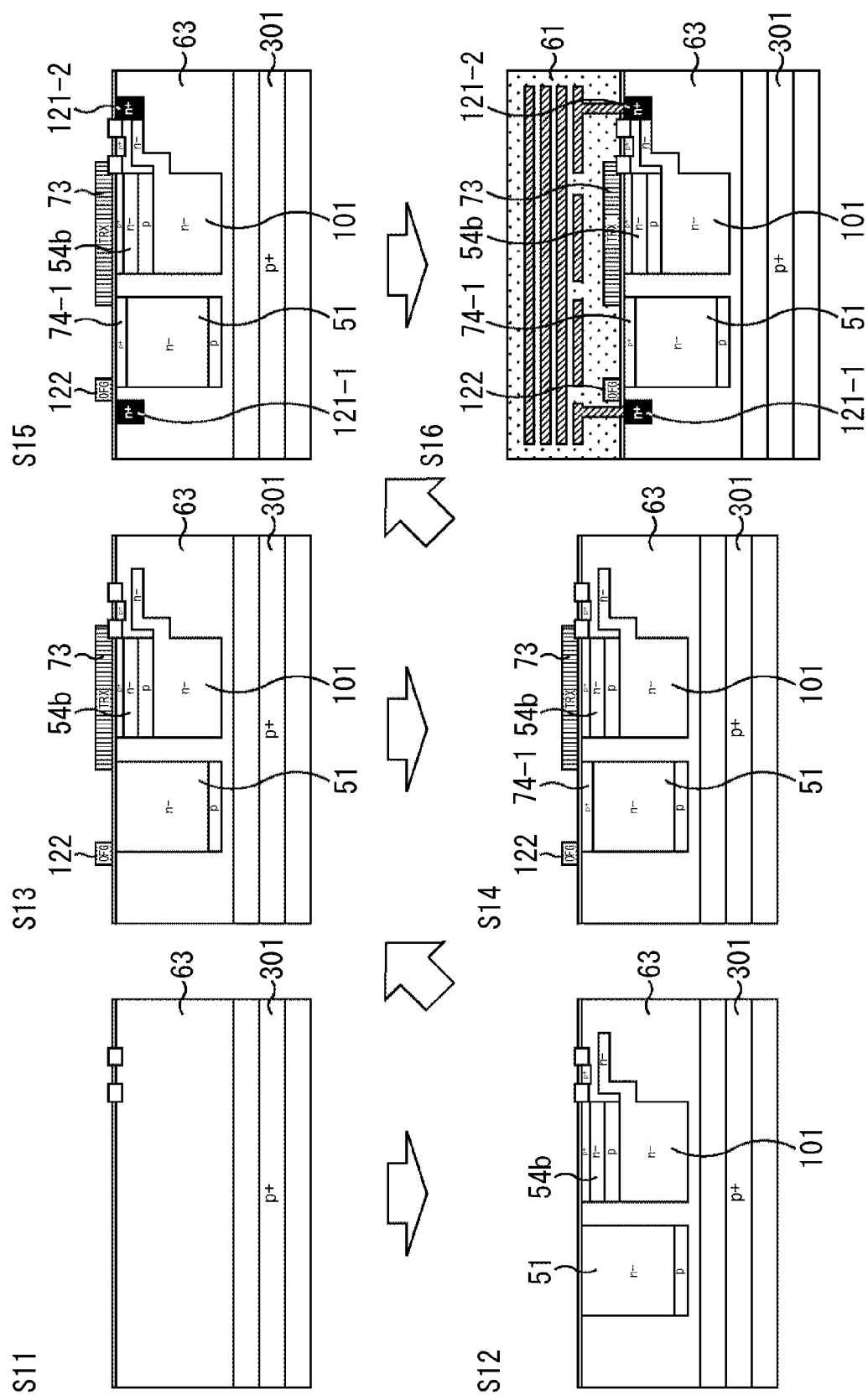
FIG. 20 is a diagram for describing manufacturing the pixel.
Figure 21:
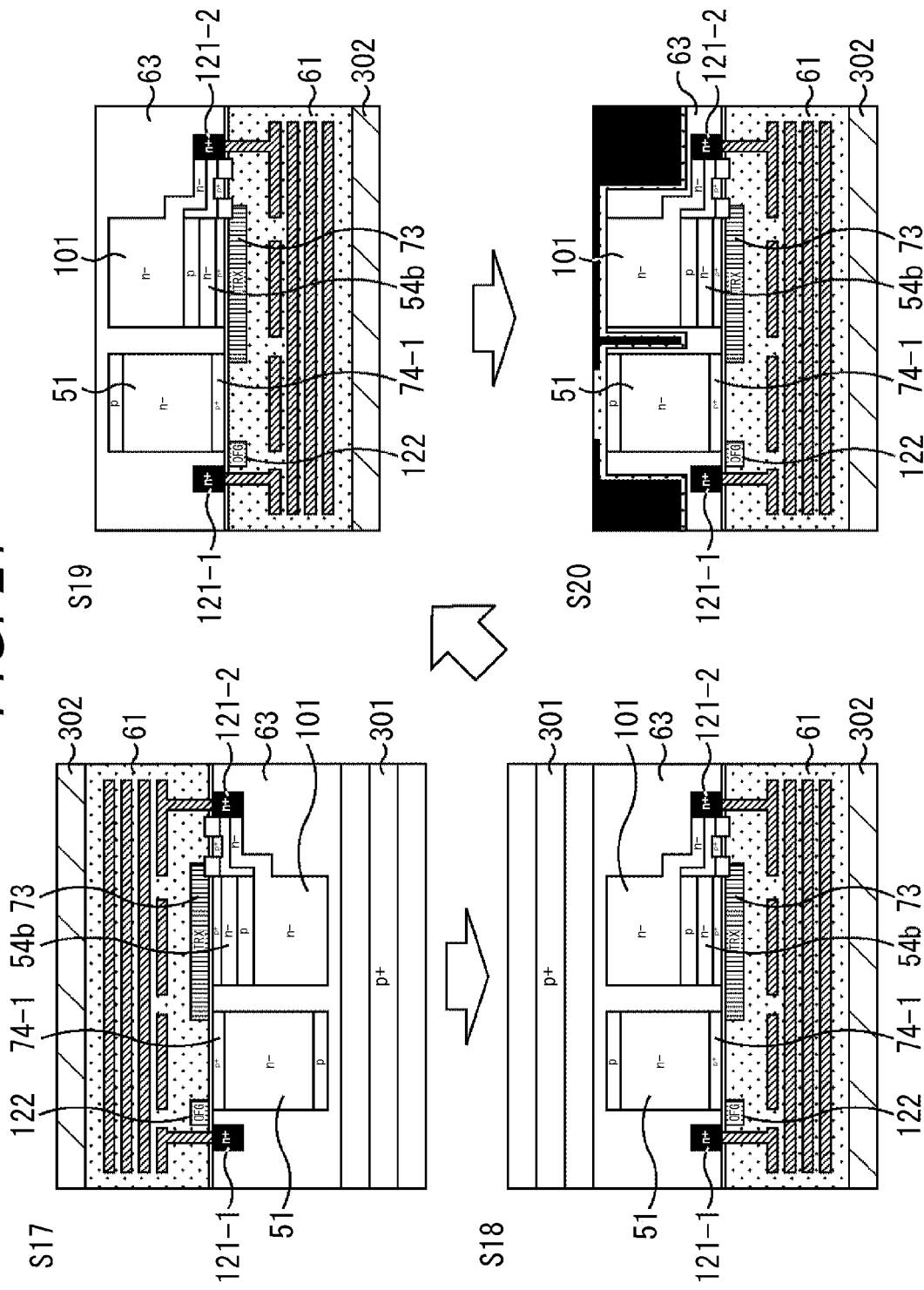
FIG. 21 is a diagram for describing manufacturing the pixel.

Manufacturing of the pixel 50 described above will be described with reference to FIG. 20 and FIG. 21. Here, the description will be continued by taking a case of manufacturing the pixel 50b as an example.

In step S11, an SOI substrate is set. Here, a case where the SOI substrate is used and a charge accumulation layer is n-type will be described as an example, but the present technology can also be applied to a case where a bulk substrate is used and the charge accumulation layer is p-type, or the like.

Furthermore, in step S11, a well of a transistor is also formed and device isolation is also formed by ion implantation. Furthermore, an etching stopper layer 301 is also formed.

In step S12, the PD 51, the charge holding part 54b, and the charge capturing region 101, which are n-type regions, are formed by ion implantation. As the charge capturing region 101, the n-type region to be connected to the discharge drain 201 is also formed. In a case where a p-type region is produced in the charge holding region 68b, the p-type region is produced in step S12.

In step S13, the OFG gate 122 and the TRX gate 73 are formed. Gate portions of these transistors are formed, for example, by polysilicon deposition by CVD and patterning of lithography.

In step S14, a hole-accumulation diode (HAD) is formed by ion implantation. The HAD is formed by generating the p-type pinning layer 74-1 in the PD 51. Dark current can be significantly suppressed by forming the HAD.

In step S15, the OFD 121, which is an n-type region, is formed by ion implantation.

Moreover, in step S16, the wiring layer 61 is stacked.

In step S17 (FIG. 21), an adhesive layer is formed on a surface side of the wiring layer 61, and after a support substrate 302 is laminated, as shown in step S18, the whole is flipped over, and a back surface of the semiconductor substrate 63 is polished by physical polishing.

In step S19, a layer on a back side of the etching stopper layer 301 of the semiconductor substrate 63 is etched by wet etching. At this time, the etching stopper layer 301 is exposed by stopping the etching with the etching stopper layer 301 containing high-concentration p-type impurities.

Moreover, after the etching stopper layer 301 is removed, the back surface of the semiconductor substrate 63 is polished by a chemical mechanical polishing (CMP) method, whereby the back side of the semiconductor substrate 63 is thinned.

In step S20, after a resist is formed on the back surface of the semiconductor substrate 63, the resist layer is exposed and developed such that the aperture is formed in a region where the embedded part 76B of the light shielding part 76 is formed. Then, dry etching is performed using the resist layer as a mask to form a trench part.

Moreover, the high dielectric constant material film 77 is deposited on the side surface and bottom surface of the trench part and the back surface of the semiconductor substrate 63. Subsequently, the light shielding part 76 is deposited from the back side of the high dielectric constant material film 77 on the back surface and in the trench part 84.

With this process, the lid part 76A is formed on the back side of the high dielectric constant material film 77, and the light shielding part 76 in which the embedded part 76B is formed inside the trench part 84 is formed.

The light shielding part 76 is formed, for example, by performing chemical vapor deposition (CVD) using tungsten as a material. Then, the light shielding part 76 is processed by dry etching to open the aperture 76C. Thereafter, for example, an atomic layer deposition (ALD) method is used to stack and planarize the high dielectric constant material film 77 with respect to the Light shielding part 76.

Thereafter, a normal method is used to form the color filter layer 65 and the on-chip lens 66. Thus, the pixel 50b is manufactured.

<Another Configuration with Discharge Drain>

As in the embodiment described above, for example, as in the embodiment described with reference to FIG. 12, descriptions of a case have been provided as an example where the discharge drain 201 that discharges the charge accumulated in the charge capturing region 101 is formed on the wiring layer 61 side (surface side), but formation on a side where the color filter layer 65 and the like are formed (back side) is also possible.

Figure 22:
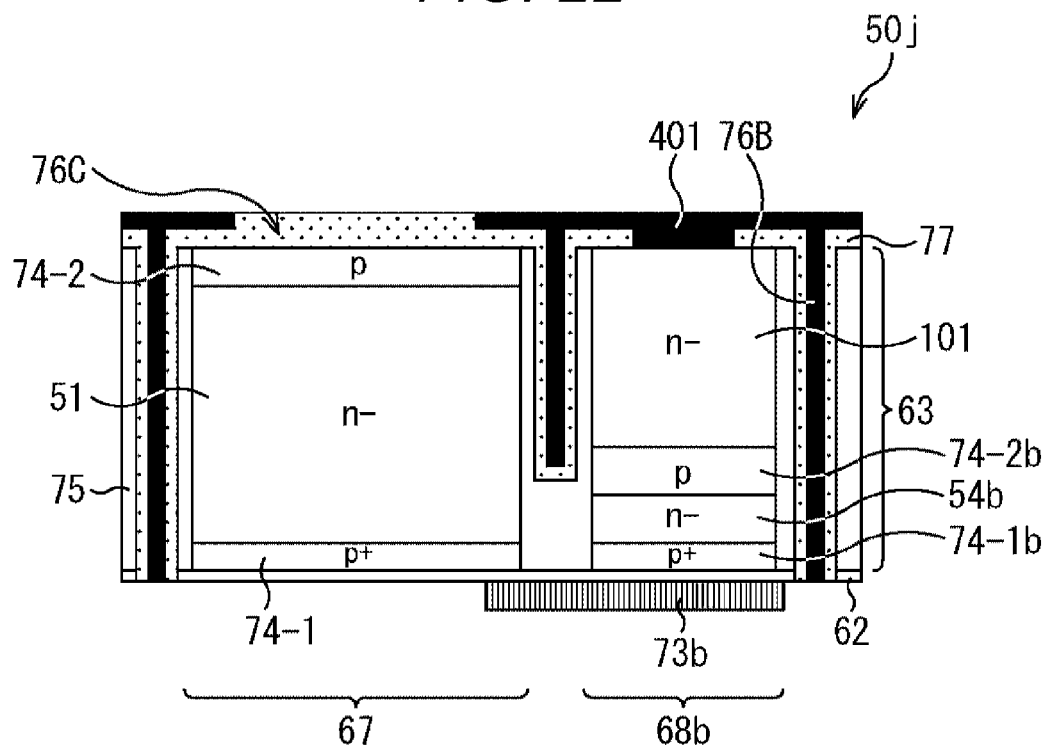
FIG. 22 is a cross-sectional view showing another configuration of the pixel.

FIG. 22 is a diagram showing a configuration of a pixel 50j in a case where a light shielding part that also functions as a discharge drain is formed on the back side. In the pixel 50j shown in FIG. 22, the same parts as in the pixel 50b shown in FIG. 4 are denoted with the same reference symbols, and the description thereof is omitted as appropriate.

As described with reference to FIG. 4, the light shielding part 76 (lid part 76A) is formed on the back side (upper side in FIG. 4) of the charge holding region 68b of the pixel 50b. This light shielding part 76 is connected to the charge capturing region 101. In order to distinguish the light shielding part 76 connected to the charge capturing region 101 from the light shielding part 76 described above, the light shielding part 76 is described as a light shielding part 401.

In other words, in the pixel 50j shown in FIG. 22, a portion corresponding to the above-described lid part 76A is the light shielding part 401. The light shielding part 401 is connected to the charge capturing region 101 by removing the high dielectric constant material film 77 formed between the charge capturing region 101 and the light shielding part 76, and forming the light shielding part 401 also in the removed portion, for example, filling the portion with tungsten or the like.

The charge accumulated in the charge capturing region 101 is extracted by the light shielding part 401 formed in this way. Furthermore, with a configuration in which potential of the light shielding part 401 is higher than potential of the p well region of the pixel region, the charge accumulated in the charge capturing region 101 is extracted.

Figure 23:
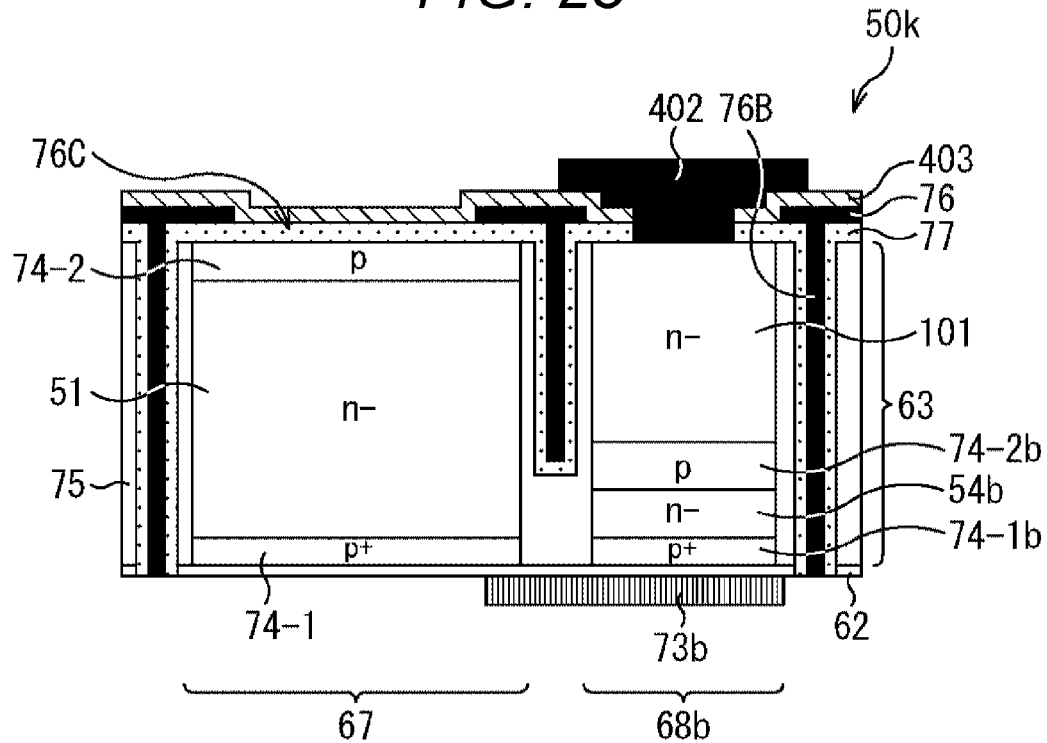
FIG. 23 is a cross-sectional view showing another configuration of the pixel.

FIG. 23 is a diagram showing another configuration of the pixel 50. In a similar manner to the pixel 50j shown in FIG. 22, the pixel 50k shown in FIG. 23 has a configuration in which a light shielding part that also functions as a discharge drain is formed on the back side, and differs in that the light shielding part is formed separately from the light shielding part 76 (each is formed independently).

With reference to FIG. 23, a portion on the charge capturing region 101 is formed such that the high dielectric constant material film 77 is removed, the portion is filled with a metal constituting the light shielding part 402, and connected to the charge capturing region 101. Furthermore, an insulating film 403 is sandwiched between the light shielding part 402 and the light shielding part 76.

In other words, in the pixel 50k shown in FIG. 23, after the light shielding part 76 is formed, the insulating film 403 is formed, and thereafter, the high dielectric constant material film 77 and the insulating film 403 on the charge capturing region 101 are removed. The light shielding part 402 is formed in the removed portion, whereby the pixel 50k having the configuration as shown in FIG. 23 is formed.

The light shielding part 401 and the light shielding part 76 implement the function of the lid part 76A described above. By providing a part formed to overlap, the light shielding part 401 and the light shielding part 76 have a configuration in which incident light is not directly incident into the charge capturing region 101.

The insulating film 403 may include the same material as the high dielectric constant material film 77, or may include a different material. Furthermore, the light shielding part 402 may include the same material (metal) as the light shielding part 76, or may include a different material.

In this case as well, with a configuration in which potential of the light shielding part 402 is higher than potential of the p well region of the pixel region, the charge accumulated in the charge capturing region 101 is extracted.

The pixel 50k has a configuration in which the light shielding part 402 and the light shielding part 76 are independent, and thus even if potential is applied to the light shielding part 402, the potential does not apply to the light shielding part 76. Therefore, the potential of the light shielding part 402 and the potential of the light shielding part 76 can be controlled independently.

Since the pixel 50j shown in FIG. 22 has a configuration in which the light shielding part 401 is connected to the light shielding part 76 (for example, light shielding part 765), if potential higher than the potential of the p well region of the pixel region is given to the light shielding part 401, potential higher than the potential of the p well region of the pixel region is also given to the light shielding part 765.

In a case where potential is applied to the light shielding part 76 in this way, there is a possibility that dark current and white spots are generated. The pixel 50k shown in FIG. 23 has a configuration in which the light shielding part 402 and the light shielding part 76 are independent, and thus even if predetermined potential is given to the light shielding part 402, the predetermined potential is not given to the light shielding part 76.

Accordingly, the pixel 50k shown in FIG. 23 can suppress the generation of dark current and white spots more than the pixel 50j shown in FIG. 22.

As shown in FIG. 22 and FIG. 23, it is also possible to have a configuration for discharging the charge accumulated in the charge capturing region 101 on the back side (side on which light is incident). Furthermore, with such a configuration, it is unnecessary to secure, for example, a region where the discharge drain is disposed in the PD region 67 and the surface side (wiring layer 61 side), and therefore it is also possible to improve the number of saturated electrons and sensitivity.

Thus, the present technology makes it possible to reduce the influence of unnecessary light components.

<Electronic Device>

The present technology is not limited to application to an imaging apparatus, but is applicable to all electronic devices that use the imaging apparatus in an image fetching unit (photoelectric conversion part) including an imaging apparatus such as a digital still camera and a video camera, a mobile terminal device having an imaging function such as a mobile phone, and a copying machine that uses the imaging apparatus in an image reader, and the like. Note that a modular form to be mounted on an electronic device, in other words, a camera module is used as the imaging apparatus in some cases.

Figure 24:
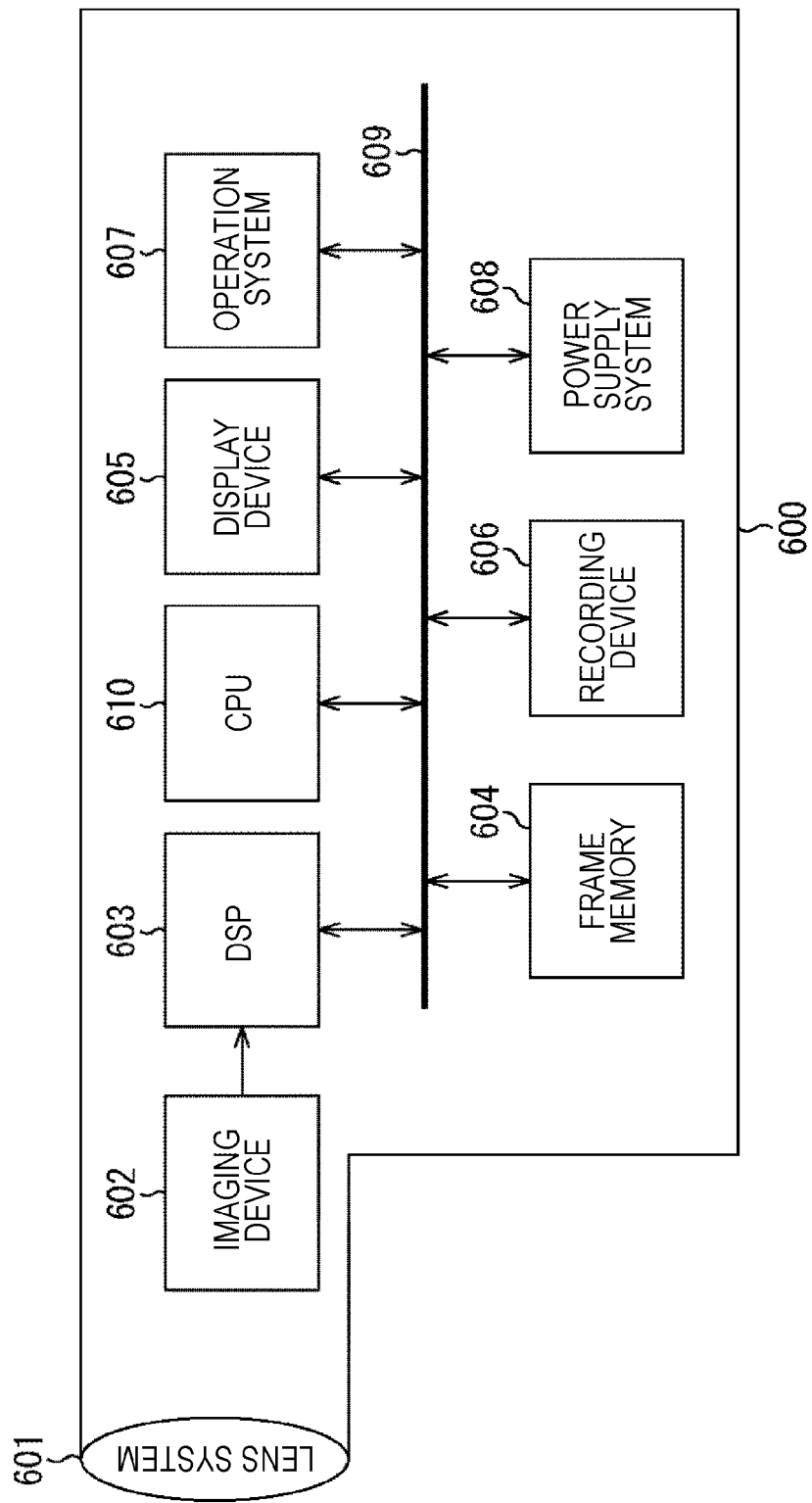
FIG. 24 is a diagram showing an exemplary configuration of an electronic device.

FIG. 24 is a block diagram showing an exemplary configuration of an imaging apparatus which is one example of an electronic device of the present disclosure. As shown in FIG. 24, an imaging apparatus 600 of the present disclosure includes an optical system including a lens group 601 and the like, an imaging device 602, a DSP circuit 603 which is a camera signal processing part, a frame memory 604, a display device 605, a recording device 606, an operation system 607, a power supply system 608, and the like.

Then, a configuration is used in which the DSP circuit 603, the frame memory 604, the display device 605, the recording device 606, the operation system 607, and the power supply system 608 are interconnected via a bus line 609. A CPU 610 controls each unit in the imaging apparatus 600.

The lens group 601 takes in incident light (image light) from a subject and forms an image on an imaged surface of the imaging device 602. The imaging device 602 converts a light amount of the incident light with which an image is formed on the imaged surface by the lens group 601 into an electric signal in pixel unit and outputs the electric signal as a pixel signal. As this imaging device 602, the imaging device (image sensor) according to the above-described embodiment can be used.

The display device 605 includes a panel type display device such as a liquid crystal display device or an organic electro luminescence (EL) display device, and displays a moving image or a still image that is imaged by the imaging device 602. The recording device 606 records the moving image or the still image imaged by the imaging device 602 on a recording medium such as a video tape or a digital versatile disk (DVD).

The operation system 607 issues operation commands for various functions possessed by the imaging apparatus under an operation of a user. The power supply system 608 appropriately supplies various power sources that serve as operation power sources for the DSP circuit 603, the frame memory 604, the display device 605, the recording device 606, and the operation system 607 to these supply targets.

Such an imaging apparatus 600 is applied to a camera module for mobile devices such as a video camera, a digital still camera, and a mobile phone. Then, in this imaging apparatus 600, the imaging device according to the embodiment described above can be used as the imaging device 602.

In the present specification, the system represents an entire device including a plurality of devices.

Note that effects described in the present specification are merely illustrative and not restrictive, and other effects may be produced.

Note that the embodiment of the present technology is not limited to the embodiment described above, and various modifications may be made without departing from the spirit of the present technology.

Note that the present technology can also have the following configurations.

(1)

An imaging device including:

a photoelectric conversion part configured to convert received light into a charge; and a holding part configured to hold a charge transferred from the photoelectric conversion part, in which the photoelectric conversion part and the holding part are formed in a semiconductor substrate having a predetermined thickness, and the holding part is formed with a thickness that is half or less of the predetermined thickness.

(2)

The imaging device according to the (1), further including a charge capturing region configured to capture a charge on a light incident side of a region where the holding part is formed.

(3)

The imaging device according to the (2), in which a light shielding part configured to shield light is further formed between the photoelectric conversion part and the charge capturing region.

(4)

The imaging device according to the (3), in which the light shielding part formed between pixels penetrates the semiconductor substrate.

(5)

The imaging device according to any one of the (2) to (4), in which the light incident side of the charge capturing region is covered with a light shielding part that shields light.

(6)

The imaging device according to any one of the (2) to (5), further including a discharge drain configured to discharge a charge from the charge capturing region.

(7)

The imaging device according to the (6), in which an overflow path from the charge capturing region to the discharge drain is formed in a region of a light shielding part that is formed in a manner of not penetrating the semiconductor substrate.

(8)

The imaging device according to the (6) or (7), in which the discharge drain is shared with an OFD.

(9)

The imaging device according to the (6) or (7), in which the discharge drain is shared with a power source of a transistor.

(10)

The imaging device according to the (6) or (7), further including an OFG dedicated to the discharge drain.

(11)

The imaging device according to any one of the (6) (10), in which the discharge drain is formed in a pixel adjacent to a pixel in which the charge capturing region is formed.

(12)

The imaging device according to the (6), in which the discharge drain is formed on the light incident side of the charge capturing region and is common to a light shielding part that shields incident light.

(13)

The imaging device according to the (6), in which the discharge drain is formed on the light incident side of the charge capturing region.

(14)

An electronic device including:

an imaging device including:

a photoelectric conversion part configured to convert received light into a charge; and a holding part configured to hold a charge transferred from the photoelectric conversion part, the photoelectric conversion part and the holding part being formed in a semiconductor substrate having a predetermined thickness, the holding part being formed with a thickness that is half or less of the predetermined thickness; and a processing unit configured to process a signal from the imaging device.

REFERENCE SIGNS LIST

30 imaging device
50 pixel
51 PD
54 charge holding part
61 wiring layer
62 oxide film
63 semiconductor substrate
64 light shielding layer
65 color filter layer
66 on-chip lens
71 wire
72 interlayer insulating film
73 TRX gate
74 surface pinning layer
75 interpixel separation region
76 light shielding part
77 high dielectric constant material film
101 charge capturing region
121 OFD
122 OFG gate
123 transistor
124 TRG gate
125 FD
201 discharge drain
401, 402 light shielding part

What is claimed is:

1. An imaging device comprising:
    a photoelectric conversion part configured to convert received light into a charge;
    a holding part configured to hold a charge transferred from the photoelectric conversion part;
    a charge capturing region configured to capture a charge on a light incident side of a region where the holding part is formed; and
    a discharge drain configured to discharge a charge from the charge capturing region,
    wherein the photoelectric conversion part and the holding part are formed in a semiconductor substrate having a predetermined thickness,
    wherein the holding part is formed with a thickness that is half or less of the predetermined thickness, and
    wherein an overflow path from the charge capturing region to the discharge drain is formed in a region of a light shielding part, and
    wherein the light shielding part does not penetrate the semiconductor substrate.

2. The imaging device according to claim 1, further comprising an overflow gate (OFG) dedicated to the discharge drain.

3. The imaging device according to claim 1, wherein the discharge drain is formed in a pixel adjacent to a pixel in which the charge capturing region is formed.

4. An imaging device comprising:
    a photoelectric conversion part configured to convert received light into a charge;
    a holding part configured to hold a charge transferred from the photoelectric conversion part;
    a charge capturing region configured to capture a charge on a light incident side of a region where the holding part is formed; and
    a discharge drain configured to discharge a charge from the charge capturing region,
    wherein the photoelectric conversion part and the holding part are formed in a semiconductor substrate having a predetermined thickness,
    wherein the holding part is formed with a thickness that is half or less of the predetermined thickness, and
    wherein the discharge drain is shared with an overflow drain (OFD).

5. The imaging device according to claim 4, wherein
a light shielding part configured to shield light is formed between the photoelectric conversion part and the charge capturing region.

6. The imaging device according to claim 5, wherein
a light shielding part that penetrates the semiconductor substrate is further formed between pixels.

7. The imaging device according to claim 4, wherein
the light incident side of the charge capturing region is covered with a light shielding part that shields light.

8. The imaging device according to claim 4, further comprising an overflow gate (OFG) dedicated to the discharge drain.

9. The imaging device according to claim 4, wherein
a light shielding part that penetrates the semiconductor substrates is further formed between pixels.

10. The imaging device according to claim 4, wherein
the discharge drain is formed in a pixel adjacent to a pixel in which the charge capturing region is formed.

11. An imaging device comprising:
a photoelectric conversion part configured to convert received light into a charge;
a holding part configured to hold a charge transferred from the photoelectric conversion part;
a charge capturing region configured to capture a charge on a light incident side of a region where the holding part is formed; and
a discharge drain configured to discharge a charge from the charge capturing region,
wherein the photoelectric conversion part and the holding part are formed in a semiconductor substrate having a predetermined thickness,
wherein the holding part is formed with a thickness that is half or less of the predetermined thickness, and
wherein the discharge drain is shared with a power source of a transistor.

12. The imaging device according to claim 11, wherein
a light shielding part configured to shield light is formed between the photoelectric conversion part and the charge capturing region.

13. The imaging device according to claim 12, wherein
a light shielding part that penetrates the semiconductor substrates is further formed between pixels.

14. The imaging device according to claim 11, wherein
the light incident side of the charge capturing region is covered with a light shielding part that shields light.

15. The imaging device according to claim 11, further comprising an overflow gate (OFG) dedicated to the discharge drain.

16. The imaging device according to claim 11, wherein
the discharge drain is formed in a pixel adjacent to a pixel in which the charge capturing region is formed.

17. An imaging device comprising:
a photoelectric conversion part configured to convert received light into a charge;
a holding part configured to hold a charge transferred from the photoelectric conversion part;
a charge capturing region configured to capture a charge on a light incident side of a region where the holding part is formed; and
a discharge drain configured to discharge a charge from the charge capturing region,
wherein the photoelectric conversion part and the holding part are formed in a semiconductor substrate having a predetermined thickness,
wherein the holding part is formed with a thickness that is half or less of the predetermined thickness, and
wherein the discharge drain is common to a light shielding part that shields incident light.

18. An imaging device comprising:
a photoelectric conversion part configured to convert received light into a charge;
a holding part configured to hold a charge transferred from the photoelectric conversion part;
a charge capturing region configured to capture a charge on a light incident side of a region where the holding part is formed; and
a discharge drain configured to discharge a charge from the charge capturing region,
wherein the photoelectric conversion part and the holding part are formed in a semiconductor substrate having a predetermined thickness,
wherein the holding part is formed with a thickness that is half or less of the predetermined thickness, and
wherein the discharge drain is formed on the light incident side of the charge capturing region.

19. The imaging device according to claim 18, wherein
a light shielding part configured to shield light is formed between the photoelectric conversion part and the charge capturing region.

20. The imaging device according to claim 18, wherein
the light incident side of the charge capturing region is covered with a light shielding part that shields light.

* * * * *